United States Patent
Tajima et al.

(10) Patent No.: US 8,557,687 B2
(45) Date of Patent: Oct. 15, 2013

(54) METHOD FOR FORMING MICROCRYSTALLINE SEMICONDUCTOR FILM AND METHOD FOR MANUFACTURING THIN FILM TRANSISTOR

(75) Inventors: Ryota Tajima, Isehara (JP); Tetsuhiro Tanaka, Isehara (JP); Ryo Tokumaru, Isehara (JP); Hidekazu Miyairi, Isehara (JP); Mitsuhiro Ichijo, Zama (JP); Taichi Nozawa, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 449 days.

(21) Appl. No.: 12/838,023

(22) Filed: Jul. 16, 2010

(65) Prior Publication Data

US 2011/0020989 A1    Jan. 27, 2011

(30) Foreign Application Priority Data

Jul. 23, 2009 (JP) ................................. 2009-172427

(51) Int. Cl.
*H01L 21/20* (2006.01)
*C23C 16/24* (2006.01)
*C23C 16/00* (2006.01)

(52) U.S. Cl.
USPC .................. 438/488; 438/158; 257/E21.104; 427/255.18

(58) Field of Classification Search
USPC .............. 438/488; 427/255.18; 257/E21.104
See application file for complete search history.

(56) References Cited

U.S. PATENT DOCUMENTS

| 4,409,134 | A | 10/1983 | Yamazaki |
| 5,686,349 | A | 11/1997 | Nakata |
| 6,078,059 | A | 6/2000 | Nakata |
| 7,422,770 | B2 | 9/2008 | Tsujimura et al. |
| 2009/0002591 | A1 | 1/2009 | Yamazaki et al. |
| 2009/0061643 | A1* | 3/2009 | Takeyama et al. ............ 438/758 |
| 2010/0006141 | A1* | 1/2010 | Oikawa et al. ................ 136/251 |
| 2010/0015811 | A1* | 1/2010 | Sato et al. ..................... 438/758 |
| 2010/0313949 | A1* | 12/2010 | Myong ......................... 136/256 |

FOREIGN PATENT DOCUMENTS

| JP | 03-205817 | 9/1991 |
| JP | 04-065120 | 3/1992 |
| JP | 04-266019 | 9/1992 |
| JP | 06-196701 | 7/1994 |
| JP | 11-233803 | 8/1999 |
| JP | 2004-146691 | 5/2004 |
| JP | 2009-044134 | 2/2009 |

* cited by examiner

*Primary Examiner* — Daniel Luke
(74) *Attorney, Agent, or Firm* — Eric J. Robinson; Robinson Intellectual Property Law Office, P.C.

(57) ABSTRACT

A microcrystalline semiconductor film having a high crystallinity is formed. Further, a thin film transistor having preferable electric characteristics and high reliability and a display device including the thin film transistor are manufactured with high mass productivity. A step in which a deposition gas containing silicon or germanium is introduced at a first flow rate and a step in which the deposition gas containing silicon or germanium is introduced at a second flow rate are repeated while hydrogen is introduced at a fixed rate, so that the hydrogen and the deposition gas containing silicon or germanium are mixed, and a high-frequency power is supplied. Therefore, a microcrystalline semiconductor film is formed over a substrate.

10 Claims, 18 Drawing Sheets

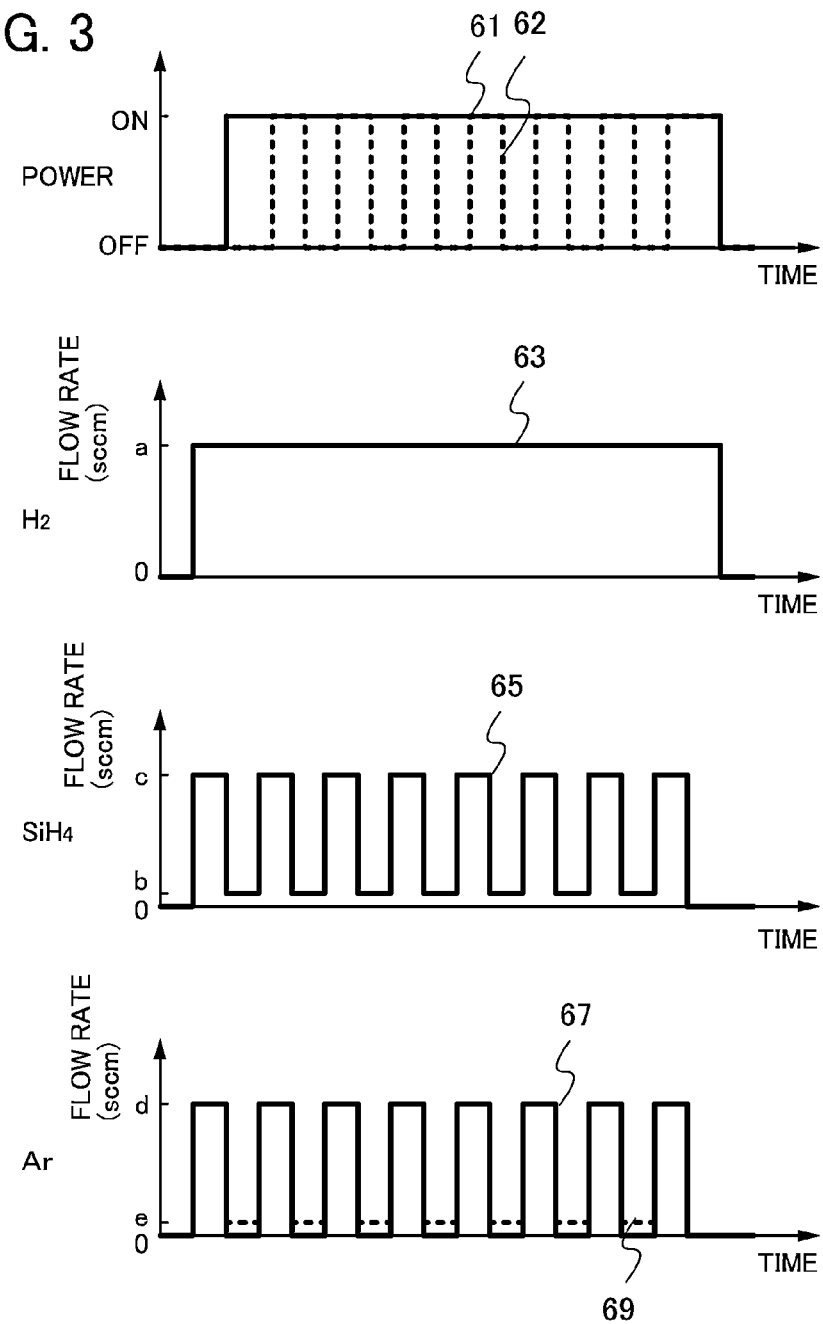

500nm

500nm

500nm

500nm

500nm

500nm

500nm

500nm

500nm

METHOD FOR FORMING MICROCRYSTALLINE SEMICONDUCTOR FILM AND METHOD FOR MANUFACTURING THIN FILM TRANSISTOR

BACKGROUND OF THE INVENTION

1. Field of the Invention

The present invention relates to a microcrystalline semiconductor film, a thin film transistor, and methods for manufacturing the microcrystalline semiconductor film and the thin film transistor. The present invention also relates to a display device to which the thin film transistor is applied.

2. Description of the Related Art

As a kind of field-effect transistor, a thin film transistor in which a channel formation region is formed in a semiconductor film formed over a substrate having an insulating surface is known. Techniques for using microcrystalline silicon for semiconductor films used in thin film transistors have been disclosed (see Patent Documents 1 to 4). A typical application of the thin film transistor is a liquid crystal television device in which the thin film transistor has been put to practical use as a switching transistor for a pixel that constitutes a display screen.

REFERENCE

[Patent Document 1] Japanese Published Patent Application No. 2009-044134
[Patent Document 2] Japanese Published Patent Application No. 2004-146691
[Patent Document 3] Japanese Published Patent Application No. H4-266019
[Patent Document 4] Japanese Published Patent Application No. H6-196701

SUMMARY OF THE INVENTION

An inversed staggered thin film transistor in which a microcrystalline semiconductor film is used for a channel formation region has problems in that the microcrystalline semiconductor film has a low crystallinity at an interface region between a gate insulating film and the microcrystalline semiconductor film and electric characteristics of the thin film transistor are poor.

In views of the above-mentioned problems, an object of one embodiment of the present invention is to form a microcrystalline semiconductor film having a high crystallinity. Another object of one embodiment of the present invention is to manufacture, with a high mass productivity, thin film transistors each having preferable electric characteristics and a high reliability and a display devices including the thin film transistors.

According to one embodiment of the present invention, a deposition gas containing silicon or germanium is constantly introduced into a treatment chamber while a flow ratio of hydrogen to the deposition gas containing silicon or germanium is periodically changed, and high-frequency power is supplied, so that a microcrystalline semiconductor film is formed over a substrate.

According to one embodiment of the present invention, a deposition gas containing silicon or germanium is constantly introduced into a treatment chamber while a flow ratio of hydrogen to the deposition gas containing silicon or germanium is periodically changed, and high-frequency power is supplied, whereby a step in which crystal nuclei are generated, a step in which the crystal nuclei are grown, and a step in which an amorphous portion of a deposition surface is etched are repeated. The growth of the crystal nuclei is performed while the density of the crystal nuclei is increased; therefore, a microcrystalline semiconductor film having a high crystallinity can be formed.

According to one embodiment of the present invention, a step in which a deposition gas containing silicon or germanium is introduced at a first flow rate and a step in which a deposition gas containing silicon or germanium is introduced at a second flow rate are repeated while hydrogen is introduced at a fixed flow rate, so that the hydrogen and the deposition gas containing silicon or germanium are mixed, and a high-frequency power is supplied, whereby a microcrystalline semiconductor film is formed over a substrate.

Note that the term "a flow ratio of hydrogen to the deposition gas containing silicon or germanium is periodically changed" refers to that a change in the flow ratio of hydrogen to the deposition gas containing silicon or germanium is repeated plural times. A rare gas may be introduced at a fixed flow rate when hydrogen and the deposition gas containing silicon or germanium are introduced. One of the flow rate of hydrogen and the flow rate of the deposition gas containing silicon or germanium is not periodically changed.

According to one embodiment of the present invention, a deposition gas containing silicon or germanium is constantly introduced into a treatment chamber while a flow ratio of hydrogen to the deposition gas containing silicon or germanium is periodically changed; a rare gas is periodically introduced or the flow rate of the rare gas is periodically changed; and high-frequency power is supplied, so that a microcrystalline semiconductor film is formed over a substrate. Note that the term "a flow rate of a rare gas is periodically changed" refers to that the flow rate of the rare gas is changed plural times.

According to one embodiment of the present invention, a step in which a deposition gas containing silicon or germanium at a first flow rate is introduced with a rare gas and a step in which the deposition gas containing silicon or germanium at a second flow is introduced without the rare gas are repeated while hydrogen is introduced at a fixed rate, so that the hydrogen and the deposition gas containing silicon or germanium are mixed, and a high-frequency power is supplied, whereby a microcrystalline semiconductor film is formed over a substrate.

According to one embodiment of the present invention, a step in which a deposition gas containing silicon or germanium at a first flow rate and a rare gas at a third flow rate are introduced and a step in which the deposition gas containing silicon or germanium at a second flow rate and the rare gas at a fourth flow rate are introduced are repeated while hydrogen is introduced at a fixed rate, so that the hydrogen and the deposition gas containing silicon or germanium are mixed, and a high-frequency power is supplied, whereby that a microcrystalline semiconductor film is formed over a substrate.

Note that the fixed flow rate of hydrogen is not periodically changed.

One embodiment of the present invention is a method for forming a thin film transistor in which a channel formation region is formed by the above-mentioned method for forming a microcrystalline semiconductor film.

Note that the first flow rate may be higher than the second flow rate. Alternatively, the first flow rate may be lower than the second flow rate.

Further, the third flow rate of the rare gas may be higher than the fourth flow rate of the rare gas. Alternatively, the third flow rate of the rare gas may be lower than the fourth flow rate of the rare gas.

When the deposition gas containing silicon or germanium is introduced into a treatment chamber while the flow ratio of hydrogen to the deposition gas containing silicon or germanium is periodically changed, the size of a crystallite included in a crystal grain can be increased, and thus, a microcrystalline semiconductor film having a high crystallinity can be formed.

When a deposition gas containing silicon or germanium is introduced into a treatment chamber while a flow ratio of hydrogen to the deposition gas containing silicon or germanium is periodically changed and the flow rate of a rare gas is periodically changed, the size of a crystallite included in a crystal grain can be increased and crystal grains can adjoin; therefore, a microcrystalline semiconductor film having a high crystallinity can be formed.

Here, the concentration is measured by secondary ion mass spectrometer (SIMS) unless a method for measuring the concentration is mentioned.

Note that on current refers to a current which flows between a source electrode and a drain electrode when a thin film transistor is in an on state. For example, in the case of an n-channel thin film transistor, on current refers to a current which flows between a source electrode and a drain electrode when gate voltage is higher than the threshold voltage of the thin film transistor.

In addition, off current refers to a current which flows between a source electrode and a drain electrode when a thin film transistor is in an off state. For example, in the case of an n-channel thin film transistor, off current refers to a current which flows between a source electrode and a drain electrode when gate voltage is lower than the threshold voltage of the thin film transistor.

As described above, a thin film transistor having a high crystallinity can be formed. Further, a thin film transistor with small off current and large on current can be manufactured with high productivity.

BRIEF DESCRIPTION OF THE DRAWINGS

In the accompanying drawings:

FIG. 3 shows timing charts illustrating a method for forming a microcrystalline semiconductor film;

DETAILED DESCRIPTION OF THE INVENTION

Figure 1:
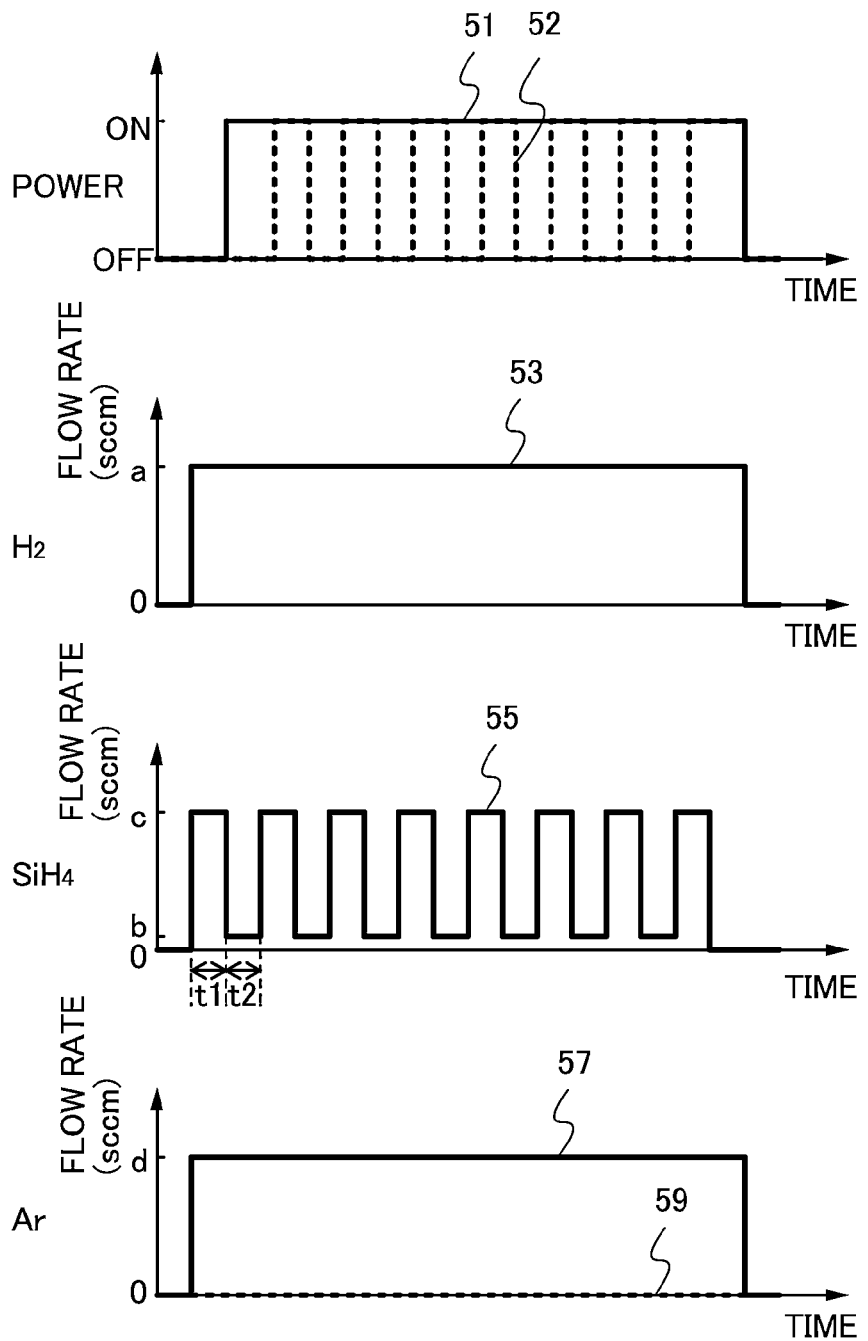
FIG. 1 shows timing charts illustrating a method for forming a microcrystalline semiconductor film.

Hereinafter, embodiments are described in detail with reference to the drawings. Note that the disclosed invention is not limited to the following description, and it is easily understood by those skilled in the art that modes and details thereof can be modified in various ways without departing from the spirit and the scope of the invention. Therefore, the disclosed invention should not be interpreted as being limited to the following description of the embodiments. Note that in the structures of the invention described hereinafter, the same portions or portions having similar functions are denoted by the same reference numerals throughout the drawings, and description thereof is not repeated.

Embodiment 1

In this embodiment, a method for forming a microcrystalline semiconductor film having a high crystallinity is described with reference to FIG. 1 and FIG. 2.

In this embodiment, a crystalline semiconductor film is formed by glow discharge plasma using a mixture of a deposition gas containing silicon or germanium and hydrogen in a treatment chamber of a plasma CVD apparatus. Here, the flow rate of hydrogen is fixed and the flow rate of the deposition gas containing silicon or germanium is controlled with time; thus, a microcrystalline semiconductor film having a high crystallinity is formed.

First, one mode of a plasma CVD apparatus which is used in this embodiment is described with reference to FIG. 2.

Figure 2:
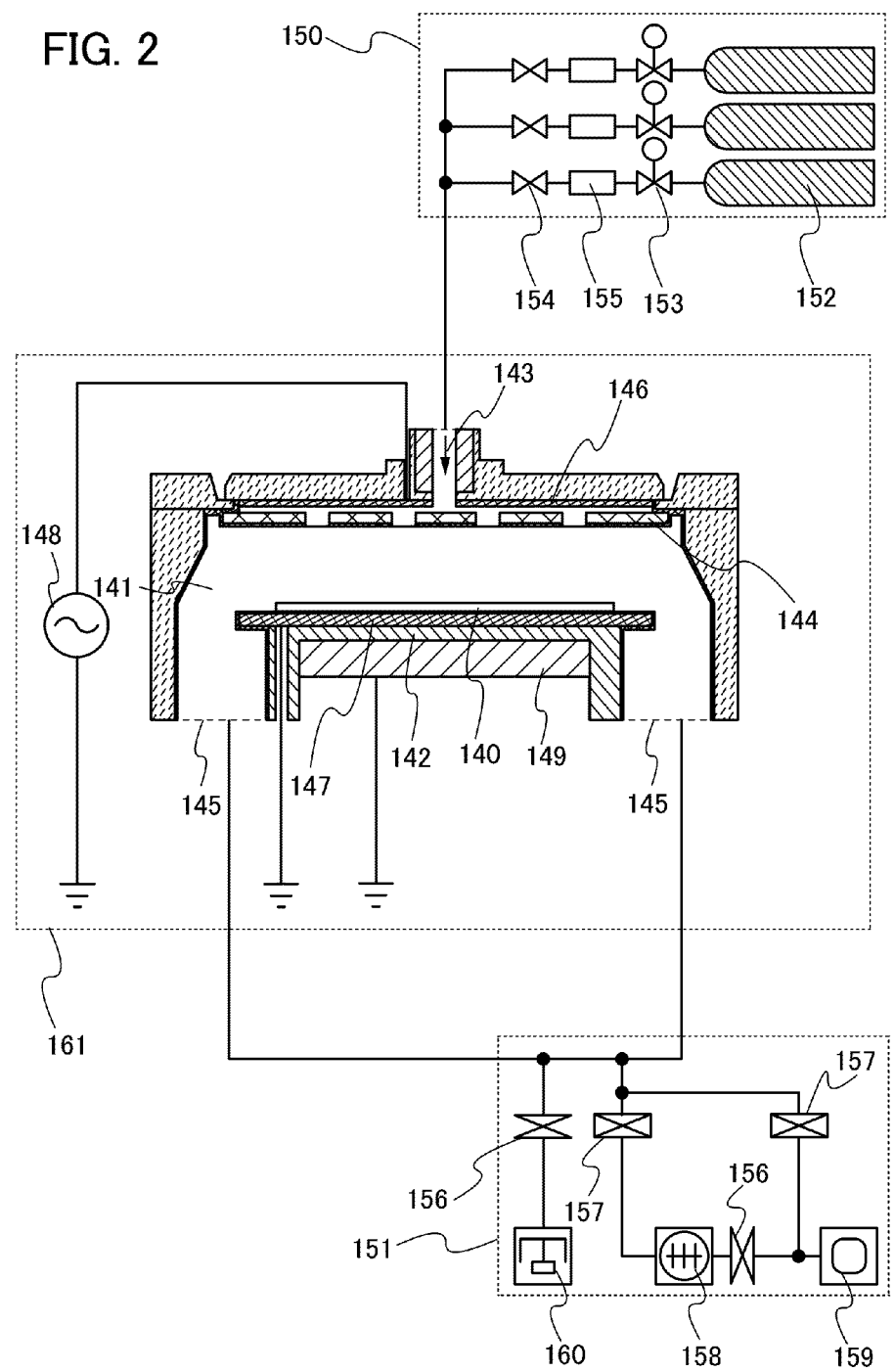
FIG. 2 is a diagram illustrating an example of a plasma treatment apparatus.

A plasma CVD apparatus 161 illustrated in FIG. 2 is connected to a gas supply unit 150 and an exhaust unit 151 and includes a treatment chamber 141, a stage 142, a gas supply portion 143, a shower plate 144, an exhaust port 145, an upper electrode 146, a lower electrode 147, a high-frequency power source 148, and a temperature controller 149.

The treatment chamber 141 is formed using a material having rigidity and the inside thereof can be evacuated to a vacuum. The treatment chamber 141 is provided with the upper electrode 146 and the lower electrode 147. Note that in FIG. 2, a capacitively coupled structure (a parallel plate type) is illustrated; however, another structure such as an inductively coupled structure may be used, as long as plasma can be generated in the treatment chamber 141 by supply of two or more kinds of high-frequency power.

When treatment is performed with the plasma CVD apparatus illustrated in FIG. 2, a given gas is introduced from the gas supply portion 143. The introduced gas is introduced into the treatment chamber 141 through the shower plate 144. When high-frequency power is supplied with the high-frequency power source 148 connected to the upper electrode 146 to excite the gas in the treatment chamber 141, plasma is generated. The gas in the treatment chamber 141 is exhausted through the exhaust port 145 which is connected to a vacuum pump. Further, the temperature controller 149 makes it possible to perform plasma treatment while an object to be processed is being heated.

The gas supply unit 150 includes a cylinder 152 which is filled with a reaction gas, a pressure adjusting valve 153, a stop valve 154, a mass flow controller 155, and the like. The treatment chamber 141 includes the shower plate between the upper electrode 146 and a substrate 140. The shower plate is processed into a plate-like shape and provided with a plurality of pores. A reaction gas that is introduced into the upper electrode 146 is introduced into the treatment chamber 141 through a hollow structure inside the upper electrode 146 and through pores of the shower plate. The flow rate of the deposition gas containing silicon or germanium which is introduced into the treatment chamber 141 can be controlled using the mass flow controller 155 of the gas supply unit 150.

The exhaust unit 151 which is connected to the treatment chamber 141 has a function of vacuum evacuation and a function of controlling the pressure inside the treatment chamber 141 to be maintained at a predetermined level when a reaction gas is made to flow. The exhaust unit 151 includes a valve 156, a conductance valve 157, a turbo molecular pump 158, a dry pump 159, and the like. Although not illustrated, n the case where the valve 156 and the conductance valve 157 are arranged in parallel, when the valve 156 is closed and the conductance valve 157 is operated to control the evacuation speed of the reaction gas, the pressure in the treatment chamber 141 can be kept in a predetermined range. Moreover, when the valve 156 having higher conductance is opened, the pressure in the treatment chamber 141 can be maintained at a predetermined level.

In the case where the treatment chamber 141 is evacuated to a pressure lower than $10^{-5}$ Pa, a cryopump 160 is preferably used together. Alternatively, in the case where exhaust is performed up to ultra-high vacuum as ultimate degree of vacuum, the inner wall of the treatment chamber 141 may be polished into a mirror surface, and the treatment chamber 141 may be provided with a heater for baking in order to reduce gas discharge from the inner wall.

Note that as illustrated in FIG. 2, when precoating treatment is performed so that a film is formed (deposited) to cover the entire inner wall of the treatment chamber 141, it is possible to prevent impurity elements attached to the inner wall of the treatment chamber 141 or impurity elements for forming the inner wall of the treatment chamber 141 from entering an element.

Note that for plasma to be generated, for example, RF (3 MHz to 30 MHz, typically 13.56 MHz, 27 MHz) plasma, VHF (30 MHz to 300 MHz, typically 60 MHz) plasma, or microwave (greater than or equal to 1 GHz, typically 2.45 GHz) plasma can be used. Note that plasma is preferably generated in a pulsed manner.

Note that a pretreatment chamber may be connected to the plasma CVD apparatus. When a substrate is preheated in the pretreatment chamber before the film formation, heating time needed before the film formation in each treatment chamber can be shortened, and accordingly throughput can be increased.

Note that the use of a multi-chamber CVD apparatus as the plasma CVD apparatus allows a layer of one kind or layers with plural kinds of compositions which are similar to each other to be formed in each chamber. Therefore, stacked films can be formed without interfaces being contaminated by a residue of formed layers or an impurity element floating in the air.

Note that the inside of the treatment chamber 141 of the plasma CVD apparatus may be cleaned with fluorine radicals. Note also that a protection film is preferably formed in the treatment chamber 141 before the film formation.

FIG. 1 shows timing charts each illustrating temporal changes in a source gas in a method for forming a microcrystalline semiconductor film described in this embodiment. In FIG. 1, a solid line 51 indicates on/off states of power supply of the plasma CVD apparatus, a solid line 53 indicates the flow rate of hydrogen, a solid line 55 indicates the flow rate of the deposition gas containing silicon or germanium (silane is used in FIG. 1), and a solid line 57 indicates the flow rate of a rare gas (argon is used in FIG. 1).

A deposition gas containing silicon or germanium, which is a source gas, and hydrogen are introduced into the treatment chamber 141 of the plasma CVD apparatus and the pressure therein is set at a predetermined level. The temperature of the substrate 140 is set to be predetermined temperature. At this time, a fixed flow rate (a flow rate a in FIG. 1) of hydrogen is introduced into the treatment chamber. On the other hand, the deposition gas containing silicon or germanium whose flow rate is periodically changed is introduced into the treatment chamber. Here, cyclical change of the flow rate is referred to as a cycle flow. In this embodiment, a step in which a flow rate c of the deposition gas containing silicon or germanium is supplied for t1 seconds and a step in which a flow rate b (b<c) of the deposition gas containing silicon or germanium is supplied for t2 seconds are repeated.

Here, the flow rate c of the deposition gas containing silicon or germanium is supplied first, and then the flow rate is changed into the flow rate b; however, the flow rate b of the deposition gas containing silicon or germanium may be supplied first, and then the flow rate may be changed into the flow rate c. Further, t1 and t2 may be the same as or different from each other. Note that t1 and t2 are each preferably several seconds to several tends of seconds. When t1 and t2 are each several minutes, for example, a microcrystalline semiconductor film having a low crystallinity with several nanometers thickness is formed in t1, and only a surface of the microcrystalline semiconductor film is reacted in t2. Accordingly, it is difficult to increase the crystallinity inside the microcrystalline semiconductor film.

As the source gas, a rare gas such as helium, neon, or argon is preferably introduced. Although the rare gas is not included in the microcrystalline semiconductor film, the rare gas promotes decomposition of the deposition gas containing silicon or germanium, so that the amount of active species from the deposition gas containing silicon or germanium in plasma is increased. Thus, the deposition rate of the microcrystalline semiconductor film can be increased. Note that as shown by a dotted line 59 in FIG. 1, the rare gas is not necessarily introduced into the treatment chamber.

Next, high-frequency power source is turned on, and plasma discharge is performed. In this embodiment, a cycle flow in which the flow ratio of hydrogen to the deposition gas containing silicon or germanium is periodically changed is conducted while plasma discharge is constantly performed. The high-frequency power source may be turned on and turned off repeatedly as shown by a dotted line 52. Note that the term "the flow ratio of hydrogen to the deposition gas containing silicon or germanium is periodically changed" refers to that a change in the flow ratio of hydrogen to the deposition gas containing silicon or germanium is repeated plural times. Here, a cycle flow in which the flow rate of the deposition gas containing silicon or germanium is periodically changed is performed.

When the flow rate of the deposition gas containing silicon or germanium is low (the flow rate b in FIG. 1), radicals are generated from the deposition gas containing silicon or germanium along with hydrogen radicals in plasma. Therefore, while the deposition surface is etched by the hydrogen radicals dissociated in plasma, the radicals (typically silyl radicals) generated from the deposition gas containing silicon or germanium bond to dangling bonds in the deposition surface, so that crystal growth occurs while crystal nuclei having a high crystallinity are formed. That is, crystal nuclei are formed while etching is performed; thus, the density of the crystal nuclei having a high crystallinity is increased. Further, the uniformity of the crystal nuclei can be increased. When the flow rate of the deposition gas containing silicon or germanium is high (the flow rate c in FIG. 1), crystal nuclei are formed and crystal growth occurs. Here, crystal growth of crystal nuclei having a high crystallinity occurs. The microcrystalline semiconductor film is formed of a plurality of crystal grains and the crystal grain includes a plurality of amorphous semiconductor regions and crystallites. The crystallite is a microcrystal that can be regarded as a single crystal. The size of a crystallite of a crystal grain can be increased by the method for forming a microcrystalline semiconductor film described in this embodiment, leading to increase in the crystallinity of the microcrystalline semiconductor film.

Note that although the flow rate of hydrogen is fixed here, the flow rate may be changed within the range of the amount of hydrogen needed for forming a microcrystalline semiconductor. However, it is not preferable that the flow rate of hydrogen is changed at the same time when the flow rate of the deposition gas containing silicon or germanium is changed because an amorphous portion in the deposition surface is not etched enough, which causes the decrease in the crystallinity. Alternatively, the flow rate of the deposition gas containing silicon or germanium may be fixed and the flow rate of hydrogen may be periodically changed.

Changing the flow rate of the source gas while the high-frequency power source is kept on can improve the deposition rate of the microcrystalline semiconductor film.

Note that the high-frequency power source is preferably turned off after the introduction of the deposition gas containing silicon or germanium into the treatment chamber is stopped. This can reduce formation of granular compounds or mealy compounds which contain silicon as their main components; thus, the yield can be increased.

Through the above steps, the microcrystalline semiconductor film having a high crystallinity can be formed.

Embodiment 2

In this embodiment, a method for forming a microcrystalline semiconductor film having a high crystallinity in which crystal grains are adjacent to each other is described with reference to FIG. 3.

FIG. 3 shows timing charts each illustrating temporal changes in a source gas in a method for forming a microcrystalline semiconductor film described in this embodiment. In FIG. 3, a solid line 61 indicates on/off states of power supply of the plasma CVD apparatus, a solid line 63 indicates the flow rate of hydrogen, a solid line 65 indicates the flow rate of the deposition gas containing silicon or germanium (silane is used in FIG. 3), and a solid line 67 indicates the flow rate of a rare gas (argon is used in FIG. 3).

A deposition gas containing silicon or germanium, which is a source gas, and hydrogen are introduced into the treatment chamber of the plasma CVD apparatus and the pressure therein is set at a predetermined level. The temperature of the substrate 140 is set to be predetermined temperature. At this time, a fixed flow rate (a flow rate a in FIG. 3) of hydrogen is introduced into the treatment chamber. On the other hand, the deposition gas containing silicon or germanium whose flow rate is periodically changed is introduced into the treatment chamber. In this embodiment, a step in which a flow rate b of the deposition gas containing silicon or germanium is supplied for t1 seconds and a step in which a flow rate c (b<c) of the deposition gas containing silicon or germanium is supplied for t2 seconds are repeated. Here, the flow rate c of the deposition gas containing silicon or germanium is supplied first, and then the flow rate is changed into the flow rate b; however, the flow rate b may be supplied first, and then the flow rate may be changed into the flow rate c. Further, t1 and t2 may be the same as or different from each other. Note that t1 and t2 are each preferably several seconds to several tends of seconds.

As the source gas, a rare gas such as helium, neon, or argon is introduced into the treatment chamber while the flow rate is periodically changed. In this embodiment, a flow rate d of the rare gas is supplied for t1 seconds and a flow rate e (e<d) of the rare gas is supplied for t2 seconds, and such supply is repeated. As shown by dotted lines, a step in which a flow rate d of the rare gas is supplied for t1 seconds and a step in which supply of the flow rate d of the rare gas is stopped for t2 seconds may be repeated. Note that the term "a flow rate of a rare gas is periodically changed" refers to that the flow rate of the rare gas is changed plural times.

The rare gas promotes decomposition of the deposition gas containing silicon or germanium in a gas phase. Thus, the amount of active species from the deposition gas containing silicon or germanium is increased in plasma, so that the deposition rate of the microcrystalline semiconductor film can be increased. The flow rate of the rare gas is periodically decreased, so that sputtering and removal of the crystal nuclei using the rare gas can be reduced, leading to an increase in the density of crystal nuclei. Further, the flow rate of the rare gas and the flow rate of the deposition gas containing silicon or germanium are periodically and simultaneously decreased and increased, so that sputtering and removal of the crystal nuclei using the rare gas can be reduced, leading to an increase in the density of crystal nuclei and an increase in the deposition rate of crystal nuclei. Because of the high density and high deposition rate of the crystal nuclei, growth of crystal grains causes collision of adjacent crystal grains, so that the crystal grains in the microcrystalline semiconductor film are in contact with each other. Therefore, a microcrystalline semiconductor film having a high crystallinity can be formed in which adjacent crystal grains are in contact with each other and there is less space between the crystal grains. Note that as shown by a dotted line 69 in FIG. 3, a step in which the flow rate d of the rare gas is supplied for t1 seconds and the flow rate e (e<d) of the rare gas is supplied for t2 seconds may be repeated.

Next, high-frequency power source is turned on, and plasma discharge is performed. Here, a cycle flow in which the flow rate of the deposition gas containing silicon or germanium is periodically changed is conducted while plasma discharge is performed. Note that the high-frequency power source may be turned on and turned off repeatedly as shown by a dotted line 62.

When the flow rate of the deposition gas containing silicon or germanium is low (the flow rate b in FIG. 3), radicals are generated from the deposition gas containing silicon or germanium along with hydrogen radicals in plasma. Therefore, while the deposition surface is etched by the hydrogen radicals dissociated in plasma, the radicals (typically silyl radicals) generated from the deposition gas containing silicon or germanium bond to dangling bonds in the deposition surface, so that crystal growth occurs while crystal nuclei having a high crystallinity are formed. That is, crystal nuclei are formed while etching is performed; thus, the density of the crystal nuclei having a high crystallinity is increased. Further, the uniformity of the crystal nuclei can be increased. When the flow rate of the deposition gas containing silicon or germanium is high (the flow rate c in FIG. 3), crystal nuclei are formed and crystal growth occurs. Here, crystal growth of crystal nuclei having a high crystallinity occurs. The microcrystalline semiconductor film is formed of a plurality of crystal grains and the crystal grain includes a plurality of amorphous semiconductor regions and crystallites. In this embodiment, sputtering of the crystal nuclei by the rare gas can be reduced by periodically introducing the rare gas or changing the rate of the rare gas, so that the density of the crystal nuclei can be increased as compared with that of the crystal nuclei in Embodiment 1. Increase of crystal grain diameter can be suppressed by collision of adjacent crystal grains, so that the crystal grain diameter is small. However, the size of the crystallite included in the crystal grain can be increased by changing the flow rate of the deposition gas containing silicon or germanium periodically. Through the above steps, the crystallinity of the microcrystalline semiconductor film can be increased since the size of the crystallite can be increased and crystal grains can adjoin by the method for forming a microcrystalline semiconductor film described in this embodiment.

Note that although the flow rate of hydrogen is fixed here, the flow rate may be changed within the range of the amount of hydrogen needed for forming a microcrystalline semiconductor. However, it is not preferable that the flow rate of hydrogen is changed at the same time when the flow rate of the deposition gas containing silicon or germanium is changed because an amorphous portion in the deposition surface is not etched enough, which causes the decrease in the crystallinity. Alternatively, the flow rate of the deposition gas containing silicon or germanium may be fixed and the flow rate of hydrogen may be periodically changed.

Changing the flow rate of the deposition gas containing silicon or germanium while the high-frequency power source is kept on can improve the deposition rate of the microcrystalline semiconductor film.

Note that the high-frequency power source is preferably turned off after the introduction of the deposition gas containing silicon or germanium into the treatment chamber is stopped. As a result, formation of granular compounds or mealy compounds which contain silicon as their main components can be suppressed; thus, the yield can be increased.

Through the above steps, the microcrystalline semiconductor film having a high crystallinity in which crystal grains are adjacent to each other can be formed.

Embodiment 3

In this embodiment, structures of a thin film transistor including a microcrystalline semiconductor film formed by any of the methods described in Embodiments 1 and 2 are described with reference to FIGS. 4A to 4C.

A microcrystalline semiconductor film formed by any of the methods described in Embodiments 1 and 2 can be used as a channel formation region in a thin film transistor. Although the microcrystalline semiconductor film can be used in both a bottom gate thin film transistor and a top gate thin film transistor, the microcrystalline semiconductor film can improve characteristics of the bottom gate thin film transistor particularly. Here, a typical structure of the bottom gate thin film transistor is described with reference to FIGS. 4A to 4C.

Figure 4A:
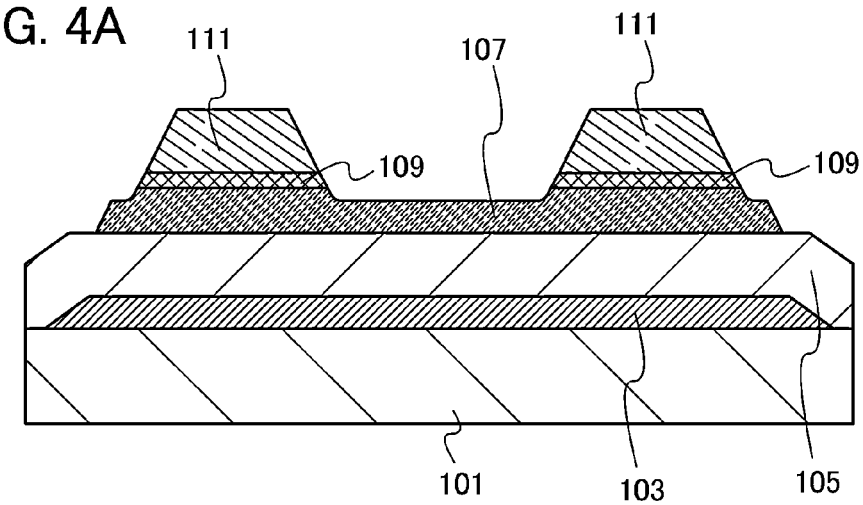
FIGS. 4A to 4C are each a cross-sectional view illustrating a structure of a thin film transistor.

A thin film transistor illustrated in FIG. 4A is a channel etched thin film transistor. A gate electrode 103 is formed over a substrate 101 and a gate insulating film 105 is formed to cover the substrate 101 and the gate electrode 103. A microcrystalline semiconductor film 107 is formed over the gate insulating film 105. A pair of impurity semiconductor films 109 is formed over the microcrystalline semiconductor film 107. A pair of wirings 111 is formed to be in contact with the impurity semiconductor films 109. The microcrystalline semiconductor film 107 having a high crystallinity is formed by any of the methods for forming a microcrystalline semiconductor film described in Embodiment 1 and Embodiment 2, and is used in a channel formation region, so that on current and field-effect mobility of the thin film transistor can be increased. Further, crystal grains in the microcrystalline semiconductor film adjoin and the contact area between the crystal grains is large, so that carriers in the channel formation region can easily move; thus, on current and field-effect mobility of the thin film transistor can be increased.

As the substrate 101, a glass substrate, a ceramic substrate, a plastic substrate that has high heat resistance enough to withstand a process temperature of this manufacturing process, or the like can be used. In the case where the substrate does not need a light-transmitting property, a metal substrate, such as a stainless steel alloy substrate, provided with an insulating film on its surface may be used. As a glass substrate, for example, an alkali-free glass substrate formed using barium borosilicate glass, aluminoborosilicate glass, aluminosilicate glass, or the like may be used. Further, as a glass substrate 301 which is explained below, a glass substrate having any of the following sizes can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

The gate electrode 103 can be formed with a single layer or a stacked layer using a metal material such as molybdenum, titanium, chromium, tantalum, tungsten, aluminum, copper, neodymium, or scandium or an alloy material which contains any of these metal materials as its main component. Alternatively, a semiconductor film typified by polycrystalline silicon doped with an impurity element such as phosphorus, or an AgPdCu alloy may be used.

As a two-layer structure for the gate electrode 103, a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, or a two-layer structure in which a titanium nitride film and a molybdenum film are stacked is preferable. As a three-layer structure for the gate electrode 103, a stack structure of a tungsten film or a tungsten nitride film, a layer of an alloy of aluminum and silicon or an alloy of aluminum and titanium, and a titanium nitride film or a titanium film is preferable. When a metal film functioning as a barrier film is stacked over a film with low electric resistance, electric resistance can be low and diffusion of a metal element from the metal film into the semiconductor film can be prevented.

In order to improve adhesion between the gate electrode 103 and the substrate 101, a film of a nitride of any of the aforementioned metal materials may be provided between the substrate 101 and the gate electrode 103.

The gate insulating film 105 can be formed with a single layer or a stacked layer using any of a silicon oxide film, a silicon nitride film, a silicon oxynitride film, and a silicon nitride oxide film.

In this specification, silicon oxynitride contains more oxygen than nitrogen, and in the case where measurements are performed using Rutherford backscattering spectrometry (RBS) and hydrogen forward scattering (HFS), silicon oxynitride preferably contains oxygen, nitrogen, silicon, and hydrogen at 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen, and in the case where measurements are performed using RBS and HFS, silicon nitride oxide preferably contains oxygen, nitrogen, silicon, and hydrogen at 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The microcrystalline semiconductor film 107 is typically formed using a microcrystalline silicon film, a microcrystalline silicon germanium film, a microcrystalline germanium film, or the like. Alternatively, a microcrystalline silicon film containing phosphorus, arsenic, or antimony, a microcrystalline silicon germanium film containing phosphorus, arsenic, or antimony, a microcrystalline germanium film containing phosphorus, arsenic, or antimony, or the like may be used. Note that boron may be added to the microcrystalline semiconductor film 107 in order to control the threshold voltage of the thin film transistor.

A microcrystalline semiconductor included in the microcrystalline semiconductor film is a semiconductor having a crystal structure (including a single crystal and a polycrystal). The microcrystalline semiconductor is a semiconductor having a third state that is stable in terms of free energy and is a crystalline semiconductor having short-range order and lattice distortion in which columnar or needle-like crystals having a diameter of 2 nm to 200 nm inclusive, preferably 10 nm to 80 nm inclusive, more preferably 20 nm to 50 nm inclusive are grown in a normal direction with respect to the substrate surface. Therefore, a crystal grain boundary is formed at the interface of the columnar or needle-like crystals in some cases.

A peak of Raman spectrum of microcrystalline silicon that is a typical example of the microcrystalline semiconductor is shifted to a lower wave number than 520 cm$^{-1}$ that represents single crystal silicon. That is, the peak of the Raman spectrum of the microcrystalline silicon exists between 520 cm$^{-1}$ that represents single crystal silicon and 480 cm$^{-1}$ that represents amorphous silicon. The microcrystalline semiconductor may contain hydrogen or halogen at least at 1 at. % in order to terminate a dangling bond. Moreover, a rare gas element such as helium, argon, krypton, or neon may be contained to further promote lattice distortion, so that stability of the microcrystalline structure is enhanced and a favorable microcrystalline semiconductor can be obtained. Such description about the microcrystalline semiconductor is disclosed in, for example, U.S. Pat. No. 4,409,134.

The concentrations of oxygen and nitrogen contained in the microcrystalline semiconductor film which are measured by secondary ion mass spectrometry are set to less than $1\times10^{18}$ atoms/cm$^3$, which is preferable since the crystallinity of the microcrystalline semiconductor film 107 can be increased.

In the case of an n-channel thin film transistor, the impurity semiconductor film 109 is formed using amorphous silicon to which phosphorus is added or microcrystalline silicon to which phosphorus is added. In the case of a p-channel thin film transistor, the impurity semiconductor film 109 is formed using amorphous silicon to which boron is added or microcrystalline silicon to which boron is added.

The wirings 111 can be formed as a single layer or a stacked layer using any of aluminum, copper, titanium, neodymium, scandium, molybdenum, chromium, tantalum, tungsten, and the like. Alternatively, an aluminum alloy to which an element for preventing a hillock is added (e.g., an aluminum-neodymium alloy which can be used for the gate electrode 103) may be used. The wirings 111 may also have a stack structure in which a film that is in contact with the impurity semiconductor film 109 is formed using titanium, tantalum, molybdenum, or tungsten, or nitride of any of these elements and aluminum or an aluminum alloy is formed thereover. Furthermore, a stacked layer structure may also be employed in which upper and lower surfaces of aluminum or an aluminum alloy may each be covered with titanium, tantalum, molybdenum, tungsten, or nitride of any of these elements.

Figure 4B:
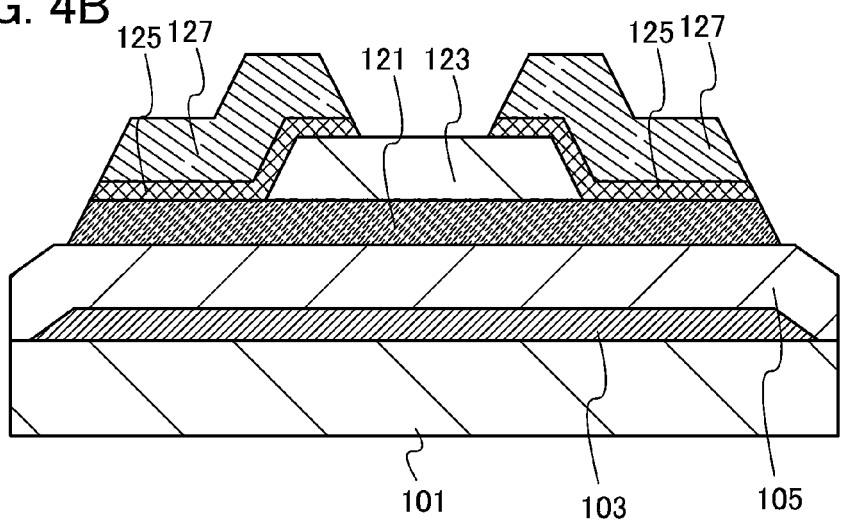

A thin film transistor illustrated in FIG. 4B is a channel stop thin film transistor. The gate electrode 103 is formed over the substrate 101 and the gate insulating film 105 is formed to cover the substrate 101 and the gate electrode 103. A microcrystalline semiconductor film 121 is formed over the gate insulating film 105. A channel protective film 123 is formed over the microcrystalline semiconductor film 121. A pair of impurity semiconductor films 125 is formed over the microcrystalline semiconductor film 121 and the channel protective film 123. A pair of wirings 127 is formed to be in contact with the impurity semiconductor films 125. The microcrystalline semiconductor film 121 having a high crystallinity is formed by any of the methods for forming a microcrystalline semiconductor film described in Embodiment 1 and Embodiment 2 and is used in a channel formation region, so that on current and field-effect mobility of the thin film transistor can be increased. Further, crystal grains in the microcrystalline semiconductor film adjoin and the contact area between the crystal grains is large, so that carriers in the channel formation region can easily move; thus, on current and field-effect mobility of the thin film transistor can be increased.

The channel protective film 123 can be formed in a manner the same as or similar to that of the gate insulating film 105. Alternatively, a polyimide, an epoxy resin, an acrylic resin, or another organic insulating film can be used to form the channel protective film 123.

The pair of impurity semiconductor films 125 can be formed using a material and a structure which are the same as or similar to those of the impurity semiconductor films 109 illustrated in FIG. 4A.

The wirings 127 can be formed using a material and a structure which are the same as or similar to those of the pair of wirings 111 illustrated in FIG. 4A.

A channel protective thin film transistor is formed using the microcrystalline semiconductor film described in Embodiment 1 or Embodiment 2 as a channel formation region and includes the channel protective film, so that on current and field-effect mobility of the thin film transistor can be increased while off current can be reduced.

Figure 4C:
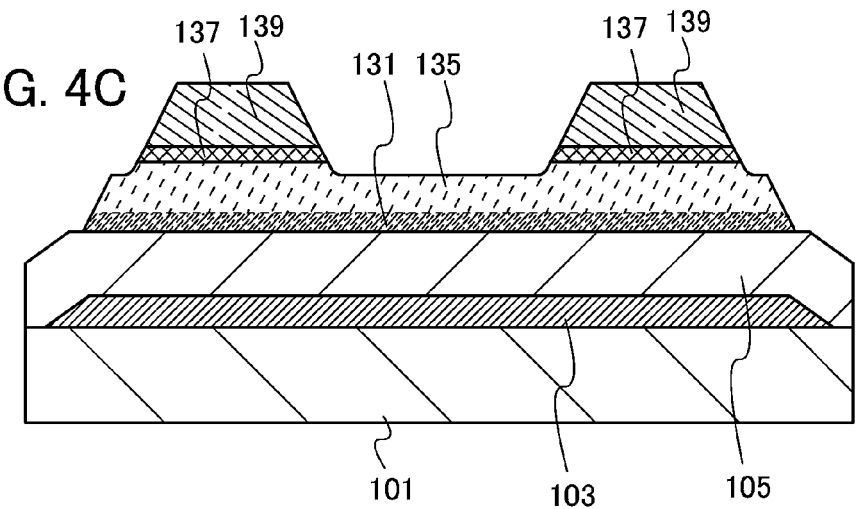

A thin film transistor illustrated in FIG. 4C is a channel etched thin film transistor and includes an amorphous semiconductor film 135 between a microcrystalline semiconductor film 131 and a pair of impurity semiconductor films 137, which is different from the structures of FIGS. 4A and 4B.

The gate electrode 103 is formed over the substrate 101 and the gate insulating film 105 is formed to cover the substrate 101 and the gate electrode 103. The microcrystalline semiconductor film 131 is formed over the gate insulating film 105. The amorphous semiconductor film 135 is formed over the microcrystalline semiconductor film 131. The pair of impurity semiconductor films 137 is formed over the amorphous semiconductor film 135. A pair of wirings 139 is formed to be in contact with the impurity semiconductor films 137. The microcrystalline semiconductor film 131 having a high crystallinity is formed by any of the methods for forming a microcrystalline semiconductor film described in Embodiment 1 and Embodiment 2, and is used in a channel formation region, so that on current and field-effect mobility of the thin film transistor can be increased. Further, crystal grains in the microcrystalline semiconductor film adjoin and the contact area between the crystal grains is large, so that carriers in the channel formation region can easily move; thus, on current and field-effect mobility of the thin film transistor can be increased.

The amorphous semiconductor film 135 can be formed using amorphous silicon, amorphous silicon containing nitrogen, amorphous silicon containing chlorine, or the like. The amorphous semiconductor film 135 is provided between the microcrystalline semiconductor film 131 and the pair of impurity semiconductor films 137, so that off current of the thin film transistor can be reduced.

As the amorphous semiconductor film 135, a semiconductor film having a peak region of a spectrum obtained by low-temperature photoluminescence spectroscopy of greater than or equal to 1.31 eV and less than or equal to 1.39 eV can be used. As the amorphous semiconductor film 135, a semiconductor film which has a low energy at an urbach edge measured by a constant photocurrent method (CPM) or photoluminescence spectroscopy and a small amount of absorption spectra of defects can be formed. That is, as compared with the conventional amorphous semiconductor film, the amorphous semiconductor is a well-ordered semiconductor which has fewer defects and whose tail of a level at a band edge in the valence band is steep. Since the tail of the level at the band edge in the valence band is steep in the amorphous semiconductor film, the band gap gets wider, and tunneling current does not easily flow. Thus, the amorphous semiconductor film is provided on the back channel side, on current and field-effect mobility can be increased while off current of the thin film transistor can be reduced.

The pair of impurity semiconductor films 137 can be formed using a material and a structure which are the same as or similar to those of the impurity semiconductor films 109 illustrated in FIG. 4A.

The pair of wirings 139 can be formed using a material and a structure which are the same as or similar to those of the pair of wirings 111 illustrated in FIG. 4A.

The thin film transistor illustrated in FIG. 4C is formed using the microcrystalline semiconductor film described in Embodiment 1 or Embodiment 2 as a channel formation region and includes the amorphous semiconductor film 135, so that on current and field-effect mobility of the thin film transistor can be increased while off current can be reduced.

Embodiment 4

In this embodiment, a method for manufacturing the thin film transistor illustrated in FIG. 4C, which is one mode of the thin film transistor in Embodiment 3, is described with reference to FIGS. 5A to 5C and FIGS. 6A to 6C.

Here, it is preferable that all thin film transistors formed over the same substrate have the same conductivity type because the number of manufacturing steps can be reduced. Therefore, in this embodiment, a method for manufacturing an n-channel thin film transistor is described.

Figure 5A:
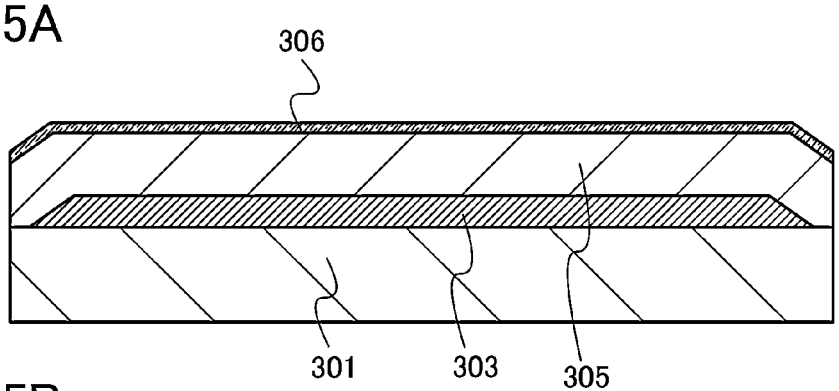
FIGS. 5A to 5C are cross-sectional views illustrating one embodiment of a method for manufacturing a thin film transistor.

As illustrated in FIG. 5A, a gate electrode 303 is formed over a substrate 301. Then, a gate insulating film 305 is formed to cover the gate electrode 303. After that, a first semiconductor film 306 is formed.

As the substrate 301, the substrate 101 described in Embodiment 3 can be used as appropriate.

The material and the structure of the gate electrode 103 described in Embodiment 3 can be employed as appropriate for the gate electrode 303.

The gate electrode 303 can be formed in such a manner that a conductive film is formed over the substrate 301 by a sputtering method or a vacuum evaporation method, a mask is formed over the conductive film by a photolithography method, an ink-jet method, or the like, and the conductive film is etched using the mask. Alternatively, the gate electrode 303 can be formed by discharging a conductive nanopaste of silver, gold, copper, or the like over the substrate by an ink-jet method and baking the conductive nanopaste. Here, a conductive film is formed over the substrate 301 and then etched using a resist mask which is formed through a first photolithography process, thereby forming the gate electrode 303.

Note that, in the photolithography process, a resist may be applied to the entire surface of the substrate. Alternatively, a resist may be printed by a printing method on a region where a resist mask is to be formed, and then, the resist may be exposed to light, whereby a resist can be saved and cost can be reduced. Further alternatively, instead of exposing a resist to light by using a light-exposure machine, a laser beam direct drawing apparatus may be used to expose a resist to light.

In addition, when side surfaces of the gate electrode 303 have a tapered shape, disconnection of the semiconductor film and a wiring film formed over the gate electrode 303 at a step portion can be reduced. In order to form the side surfaces of the gate electrode 303 into a tapered shape, etching may be performed while the resist mask is reduced in its size.

Through the step of forming the gate electrode 303, a gate wiring (a scan line) and a capacitor wiring can also be formed at the same time. Note that a "scan line" means a wiring which selects a pixel, while a "capacitor wiring" means a wiring which is connected to one of electrodes of a capacitor in a pixel. However, without limitation thereto, the gate electrode 303 and one or both of the gate wiring and the capacitor wiring may be formed in separate steps.

The material and the structure of the gate insulating film 105 described in Embodiment 3 can be employed as appropriate for the gate insulating film 305. The gate insulating film 305 can be formed by a sputtering method, a CVD method, a coating method, a printing method, or the like as appropriate.

Further, by forming a silicon oxide film by a CVD method using an organosilane gas as an outermost surface of the gate insulating film 305, the crystallinity of the first semiconductor film which is formed later can be improved, so that on current and field-effect mobility of the thin film transistor can be increased. As the organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: SiH(OC$_2$H$_5$)$_3$), or trisdimethylaminosilane (chemical formula: SiH(N(CH$_3$)$_2$)$_3$) can be used.

The first semiconductor film 306 is formed by the method for forming a microcrystalline semiconductor film described in Embodiment 1 or Embodiment 2.

The thickness of the first semiconductor film 306 is preferably 3 nm to 100 nm, more preferably 5 nm to 50 nm This is because when the first semiconductor film 306 is too thin, on current of the thin film transistor is reduced. Further, when the first semiconductor film 306 is too thick, off current of the thin film transistor is increased while the thin film transistor operates at a high temperature. The thickness of the first semiconductor film 306 is set to 3 nm to 100 nm, preferably 5 nm to 50 nm, whereby on current and off current of the thin film transistor can be controlled.

The first semiconductor film 306 is formed by glow discharge plasma using a mixture of a deposition gas containing silicon or germanium and hydrogen. Alternatively, the first semiconductor film 306 is formed by glow discharge plasma using a mixture of a deposition gas containing silicon or germanium, hydrogen, and a rare gas such as helium, neon, or krypton. Microcrystalline silicon, microcrystalline silicon germanium, microcrystalline germanium, or the like is formed using a mixture which is obtained by diluting the deposition gas containing silicon or germanium with hydrogen whose flow rate is 10 to 2000 times, preferably 10 to 200 times that of the deposition gas. The deposition temperature at this time is preferably a room temperature to 300° C., more preferably, 200° C. to 280° C.

Typical examples of the deposition gas containing silicon or germanium include silane (SiH$_4$), disilane (Si$_2$H$_6$), germane (GeH$_4$), and digermane (Ge$_2$H$_6$).

When the gate insulating film 305 is formed using a silicon nitride film, in the case where the first semiconductor film 306 is a microcrystalline semiconductor film, an amorphous semiconductor region is likely to be formed at an early stage of deposition, so that the crystallinity of the microcrystalline semiconductor film is low and electric characteristics of the thin film transistor are poor. Therefore, when the gate insulating film 305 is formed using a silicon nitride film, deposition of the microcrystalline semiconductor film is preferably performed under a low temperature condition. Typically, the low temperature condition in which the temperature for deposition of the microcrystalline semiconductor film is 200° C. to 250° C. is preferable. When the low temperature condition is employed, initial nucleation density is increased, an amorphous component over the gate insulating film is reduced, and the crystallinity of the microcrystalline semiconductor film is improved.

Note that before the first semiconductor film 306 is formed, impurity elements in the treatment chamber of the CVD apparatus are removed by introducing the deposition gas containing silicon or germanium while exhausting the gas in the treatment chamber, so that the amount of the impurity elements in the gate insulating film 305 and the first semiconductor film 306 of the thin film transistor, which are formed later, can be reduced, and thus, electric characteristics of the thin film transistor can be improved.

Alternatively, before the first semiconductor film 306 is formed, a surface of the gate insulating film 305 may be exposed to oxygen plasma, hydrogen plasma, or the like.

Figure 5B:
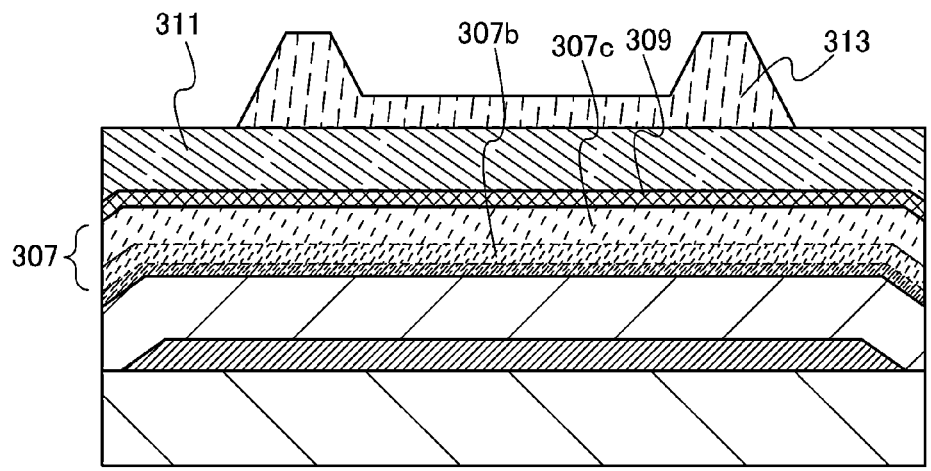
Figure 5C:
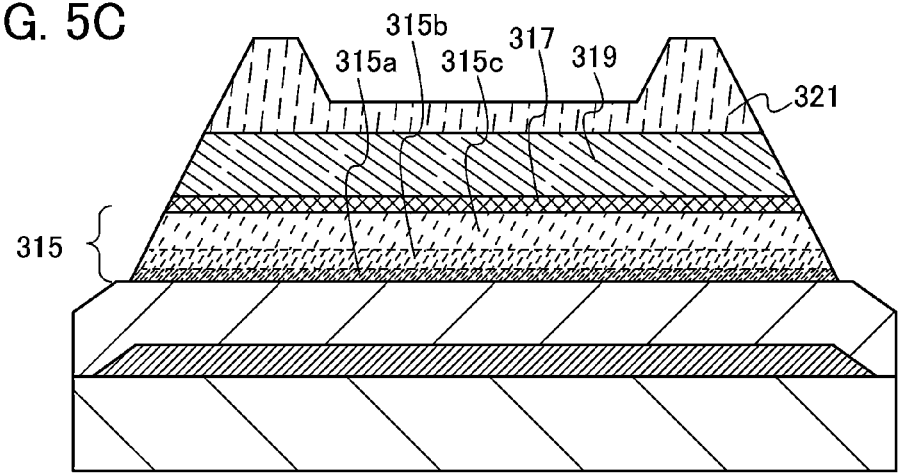

Next, as illustrated in FIG. 5B, a second semiconductor film 307 is formed over the first semiconductor film 306. Here, the second semiconductor film 307 includes a mixed region 307b and a region 307c including an amorphous semiconductor. Then, an impurity semiconductor film 309 and a conductive film 311 are formed over the second semiconductor film 307. After that, a resist mask 313 is formed over the conductive film 311.

The second semiconductor film 307 which includes the mixed region 307b and the region 307c including an amorphous semiconductor can be formed under a condition that a crystal grows partly by using the first semiconductor film 306 as a seed crystal.

The second semiconductor film 307 is formed by glow discharge plasma using a mixture of a deposition gas containing silicon or germanium, hydrogen, and a gas containing nitrogen. Examples of the gas containing nitrogen include ammonia, nitrogen, nitrogen fluoride, nitrogen chloride, chloroamine, fluoroamine, and the like. Glow discharge plasma can be generated in a manner the same as or similar to that of the first semiconductor film 306.

At this time, the flow rate of the deposition gas containing silicon or germanium is the same as the flow rate c of silane in FIG. 1 and FIG. 3 and a gas containing nitrogen is used as the source gas, whereby crystal growth can be further suppressed as compared to the deposition condition of the first semiconductor film 306. As a result, the mixed region 307b and the region 107c including an amorphous semiconductor, which is formed using a well-ordered semiconductor film having fewer defects and a steep tail of a level at a band edge in the valence band, can be formed in the second semiconductor film 307.

Here, a typical example of a condition for forming the second semiconductor film 307 is as follows. The flow rate of hydrogen is 10 to 2000 times, preferably, 10 to 200 times that of the deposition gas containing silicon or germanium. Note that in a typical example of a condition for forming a normal amorphous semiconductor film, the flow rate of hydrogen is 0 to 5 times that of the deposition gas containing silicon or germanium.

A rare gas such as helium, neon, argon, xenon, or krypton is introduced into the source gas of the second semiconductor film 307, whereby the deposition rate of the second semiconductor film 307 can be increased.

The thickness of the second semiconductor film 307 is preferably 50 nm to 350 nm, more preferably, 120 nm to 250 nm.

At an early stage of deposition of the second semiconductor film 307, since a gas containing nitrogen is included in the source gas, the crystal growth is partly suppressed; therefore, while conical or pyramidal microcrystalline semiconductor regions grow, an amorphous semiconductor region filling a space between the conical or pyramidal microcrystalline semiconductor regions is formed. A region formed in this manner where both the microcrystalline semiconductor and the amorphous semiconductor coexist is referred to as the mixed region 307b. Further, crystal growth of the conical or pyramidal microcrystalline semiconductor regions is stopped, so that a region where the microcrystalline semiconductor is not included and only the amorphous semiconductor is included is formed. Such a region where the microcrystalline semiconductor is not included and only the amorphous semiconductor is included is referred to as the region 307c including an amorphous semiconductor. Note that before the conical or pyramidal microcrystalline semiconductor regions grow, a microcrystalline semiconductor film is formed over the entire surface of the first semiconductor film 306 using the first semiconductor film 306 as a seed crystal in some cases.

Here, the second semiconductor film 307 including the mixed region 307b and the region 307c including an amorphous semiconductor is formed using the source gas, in which a gas containing nitrogen is included, of the second semiconductor film 307. Alternatively, as another method for forming the second semiconductor film 307, the following may be performed: a surface of the first semiconductor film 306 is exposed to a gas containing nitrogen so that nitrogen is adsorbed to the surface of the first semiconductor film 306; and then the second semiconductor film 307 including the mixed region 307b and the region 307c including an amorphous semiconductor is formed using a deposition gas containing silicon or germanium and hydrogen as the source gas.

The impurity semiconductor film 309 is formed by glow discharge plasma using a mixture of a deposition gas containing silicon, hydrogen, and phosphine (diluted with hydrogen or silane) in the treatment chamber of the plasma CVD apparatus. Amorphous silicon to which phosphorus is added or microcrystalline silicon to which phosphorus is added is formed by diluting the deposition gas containing silicon with hydrogen. Note that in the case of manufacturing a p-channel thin film transistor, as the impurity semiconductor film 309, amorphous silicon to which boron is added or microcrystalline silicon to which boron is added may be formed by glow discharge plasma, using diborane instead of phosphine.

Here, structures of the second semiconductor film 307 that is formed between the gate insulating film 305 and the impurity semiconductor film 309 are described with reference to FIGS. 7A and 7B, FIG. 8, and FIGS. 9A and 9B. FIGS. 7A and 7B, FIG. 8, and FIGS. 9A and 9B are each an enlarged view between the gate insulating film 305 and the impurity semiconductor film 309.

Figure 7A:
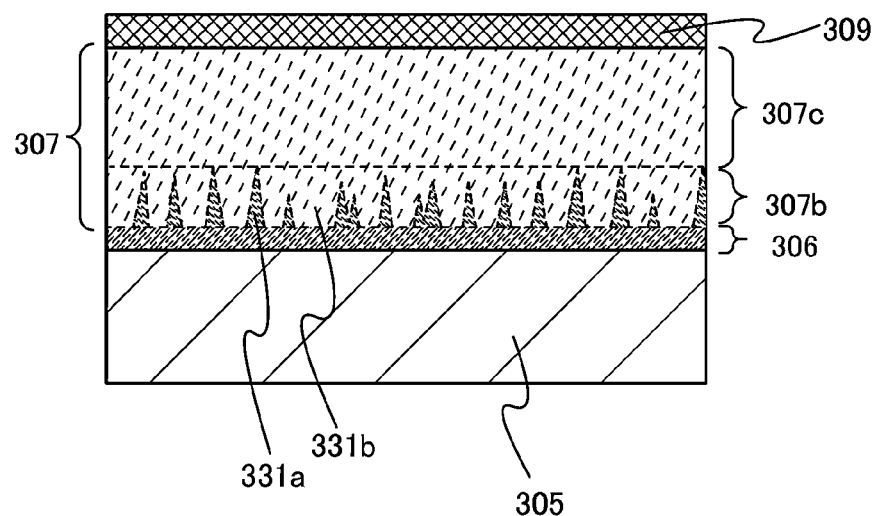
FIGS. 7A and 7B are each a diagram illustrating one embodiment of a method for manufacturing a thin film transistor.

As illustrated in FIG. 7A, the mixed region 307b includes microcrystalline semiconductor regions 331a each of which grows with a projecting shape from the surface of the first semiconductor film 306 and a microcrystalline semiconductor region 331b which fills a space between the microcrystalline semiconductor regions 331a.

The microcrystalline semiconductor region 331a is a microcrystalline semiconductor having a projecting (conical or pyramidal) shape whose tip is narrowed from the gate insulating film 305 toward the region 307c including an amorphous semiconductor. Note that the microcrystalline semiconductor region 331a may be a microcrystalline semiconductor having a projecting (inverted conical or inverted pyramidal) shape whose width is increased from the gate insulating film 305 toward the region 307c including an amorphous semiconductor.

Note that the amorphous semiconductor region 331b included in the mixed region 307b may contain a semiconductor crystal grain having a grain size of 1 nm to 10 nm inclusive, preferably 1 nm to 5 nm inclusive.

Figure 7B:
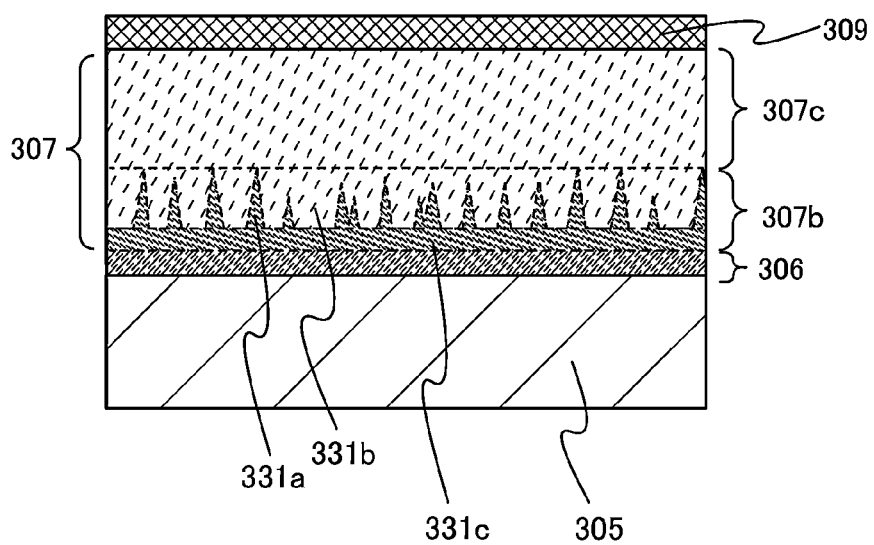

Alternatively, as illustrated in FIG. 7B, the mixed region 307b includes a microcrystalline semiconductor region 331c and the microcrystalline semiconductor region 331a which are successively formed, in some cases. The microcrystalline semiconductor region 331c is formed with a uniform thickness over the first semiconductor film 306. The microcrystalline semiconductor region 331a has a projecting (conical or pyramidal) shape whose end is narrowed from the gate insulating film 305 toward the region 307c including an amorphous semiconductor.

Note that, in FIGS. 7A and 7B, the amorphous semiconductor region 331b included in the mixed region 307b is a semiconductor, the quality of which is substantially the same as the quality of the region 307c including an amorphous semiconductor.

According to the above, an interface between a region formed using a microcrystalline semiconductor and a region formed using an amorphous semiconductor may correspond to the interface between the microcrystalline semiconductor region 331a and the amorphous semiconductor region 331b in the mixed region 307b. Therefore, the interface between the microcrystalline semiconductor and the amorphous semiconductor can be described as uneven or zigzag in a cross-sectional view.

In the mixed region 307b, in the case where the microcrystalline semiconductor region 331a includes a semiconductor crystal grain having a projecting (conical or pyramidal) shape whose end is narrowed from the gate insulating film 305 toward the region 307c including an amorphous semiconductor, the proportion of the microcrystalline semiconductor in the vicinity of the first semiconductor film 306 is higher than that in the vicinity of the region 307c including an amorphous semiconductor. The microcrystalline semiconductor region 331a grows in a thickness direction from the surface of the first semiconductor film 306. However, by adding a gas containing nitrogen to the source gas or by adding a gas containing nitrogen to the source gas and reducing the flow rate of hydrogen to silane from that under the condition for forming the first semiconductor film 306, crystal growth of the microcrystalline semiconductor region 331a is suppressed, the semiconductor crystal grain becomes a conical or pyramidal shape, and the amorphous semiconductor is gradually deposited. This is because the solid solubility of nitrogen in the microcrystalline semiconductor region is lower than the solid solubility of nitrogen in the amorphous semiconductor region.

The total thickness of the first semiconductor film 306 and the mixed region 307b, that is, the distance from the interface between the gate insulating film 305 and the first semiconductor film 306 to the tip of the projection (projecting portion) of the microcrystalline semiconductor region 331a is set to greater than or equal to 3 nm and less than or equal to 410 nm, preferably greater than or equal to 20 nm and less than or equal to 100 nm. The total thickness of the first semiconductor film 306 and the mixed region 307b is set to greater than or equal to 3 nm and less than or equal to 410 nm, preferably greater than or equal to 20 nm and less than or equal to 100 nm, so that off current of the thin film transistor can be reduced.

As described above, the region 307c including an amorphous semiconductor is a semiconductor, the quality of which is substantially the same as the quality of the amorphous semiconductor region 331b, and contains nitrogen. Further, the region 307c including an amorphous semiconductor contains a semiconductor crystal grain having a grain size of 1 nm to 10 nm inclusive, preferably 1 nm to 5 nm inclusive, in some cases. Here, the region 307c including an amorphous semiconductor is a semiconductor film having lower energy at an Urbach edge measured by a CPM or photoluminescence spectroscopy and a smaller amount of the absorption spectrum of defects as compared with a conventional amorphous semiconductor. That is, as compared with the conventional amorphous semiconductor, the region 307c including an amorphous semiconductor is a well-ordered semiconductor which has fewer defects and a steep tail of a level at a band edge in the valence band. Since the region 307c including an amorphous semiconductor has a steep tail of a level at a band edge in the valence band, the band gap gets wider and tunneling current does not easily flow. Therefore, by providing the region 307c including an amorphous semiconductor on the back channel side, off current of the thin film transistor can be reduced. In addition, by providing the region 307c including an amorphous semiconductor, on current and field-effect mobility can be increased.

Further, a peak region of a spectrum obtained by performing low-temperature photoluminescence spectroscopy on the region 307c including an amorphous semiconductor is 1.31 eV to 1.39 eV inclusive. Note that a peak region of a spectrum obtained by performing low-temperature photoluminescence spectroscopy on a microcrystalline semiconductor film, typically a microcrystalline silicon film is 0.98 eV to 1.02 eV inclusive. Accordingly, the region 307c including an amorphous semiconductor is different from a microcrystalline semiconductor film.

Note that an amorphous semiconductor included in the region 307c including an amorphous semiconductor is typically amorphous silicon.

Note that nitrogen included in the mixed region 307b and the region 307c including an amorphous semiconductor may exist as an NH group or an $NH_2$ group, for example.

Figure 8:
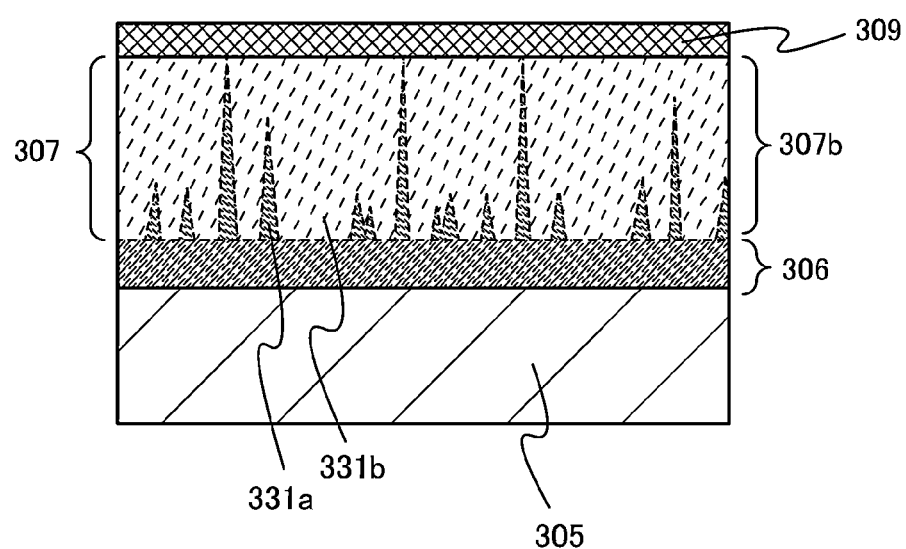
FIG. 8 is a diagram illustrating one embodiment of a method for manufacturing a thin film transistor.

Alternatively, as illustrated in FIG. 8, the mixed region 307b may entirely fill a space between the first semiconductor film 306 and the impurity semiconductor film 309. In other words, the second semiconductor film 307 may correspond to the mixed region 307b. It is preferable that the structure illustrated in FIG. 8 have the proportion of the microcrystalline semiconductor region 331a in the mixed region 307b lower than the structures illustrated in FIGS. 7A and 7B. Further, the proportion of the microcrystalline semiconductor region 331a in the mixed region 307b is preferably low in a region between the source and drain regions, that is, a region where carriers flow. As a result, off current of the thin film transistor can be reduced. In addition, in the mixed region 307b, it is possible to reduce resistance in a vertical direction (a thickness direction), that is, resistance between the semiconductor film and the source and drain regions, when the thin film transistor is in an on state and voltage is applied between the source and drain electrodes which are formed using wirings, and thus on current and field-effect mobility of the thin film transistor can be increased.

Note that the mixed region 307b illustrated in FIG. 8 may include the microcrystalline semiconductor region 331c as illustrated in FIG. 7B.

Figure 9A:
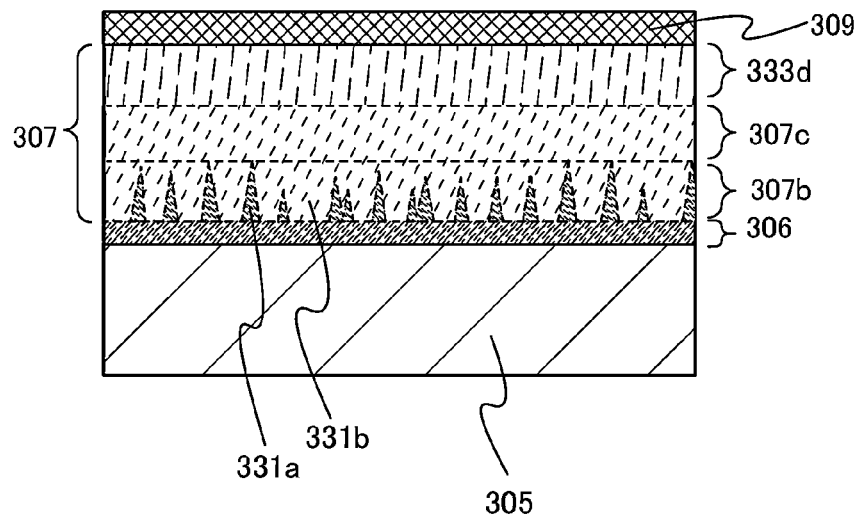
FIGS. 9A and 9B are each a diagram illustrating one embodiment of a method for manufacturing a thin film transistor.
Figure 9B:
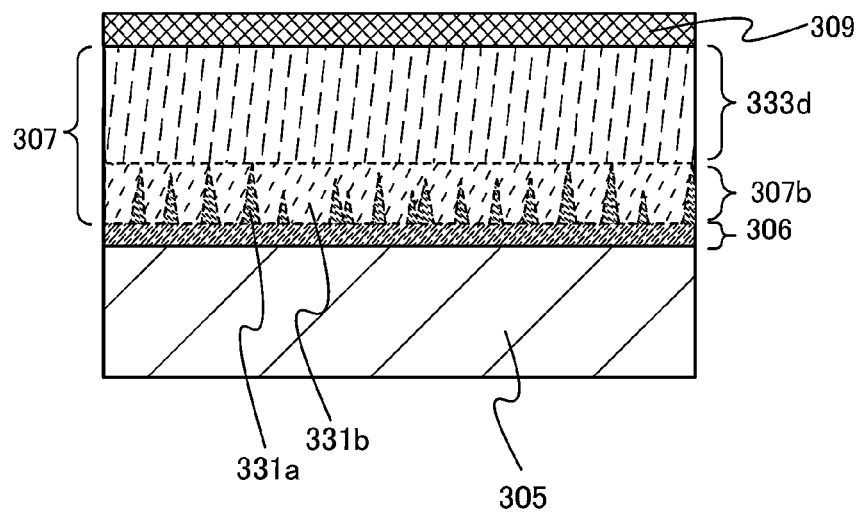

Further, a conventional amorphous semiconductor region 333d may be provided between the region 307c including an amorphous semiconductor and the impurity semiconductor film 309 as illustrated in FIG. 9A. In other words, the second semiconductor film 307 may include the mixed region 307b, the region 307c including an amorphous semiconductor, and the conventional amorphous semiconductor region 333d. Alternatively, the conventional amorphous semiconductor region 333d may be provided between the mixed region 307b and the impurity semiconductor film 309 as illustrated in FIG. 9B. In other words, the second semiconductor film 307 may include the mixed region 307b and the conventional amorphous semiconductor region 333d. The structures illustrated in FIGS. 9A and 9B enable off current of the thin film transistor to decrease.

Note that the mixed region 307b illustrated in FIGS. 9A and 9B may include the microcrystalline semiconductor region 331c as illustrated in FIG. 7B.

Since the mixed region 307b includes the microcrystalline semiconductor region 331a having a conical or pyramidal shape, it is possible to reduce resistance in a vertical direction (a thickness direction), that is, resistance of the first semiconductor film 306, the mixed region 307b, and the region 307c including an amorphous semiconductor, when the thin film transistor is in an on state and voltage is applied between the source and drain electrodes.

As described above, nitrogen contained in the mixed region 307b may exist as an NH group or an $NH_2$ group. This is because defects are reduced when an NH group or an $NH_2$ group is bonded to dangling bonds of silicon atoms at the interface between a plurality of the microcrystalline semiconductor regions included in the microcrystalline semiconductor region 331a, the interface between the microcrystalline semiconductor region 331a and the amorphous semiconductor region 331b, or the interface between the first semiconductor film 306 and the amorphous semiconductor region 331b. Accordingly, the nitrogen concentration of the second semiconductor film 307 is set to higher than or equal to $1 \times 10^{19}$ atoms/cm$^3$ and lower than or equal to $1 \times 10^{21}$ atoms/cm$^3$, preferably higher than or equal to $1 \times 10^{20}$ atoms/cm$^3$ and lower than or equal to $1 \times 10^{21}$ atoms/cm$^3$, and thus the dangling bonds of silicon atoms can be easily cross-linked with an NH group, so that carriers can flow easily. Alternatively, the dangling bonds of the semiconductor atoms at the aforementioned interfaces are terminated with an $NH_2$ group, so that the defect level disappears. As a result, resistance in a vertical direction (a thickness direction) is reduced when the thin film transistor is in an on state and voltage is applied between the source and drain electrodes. That is, field-effect mobility and on current of the thin film transistor are increased.

By making the oxygen concentration of the mixed region 307b lower than the nitrogen concentration of the mixed region 307b, bonds which interrupt carrier transfer in defects at the interface between the microcrystalline semiconductor region 331a and the amorphous semiconductor region 331b or at the interface between semiconductor crystal grains can be reduced.

In this manner, off current of the thin film transistor can be reduced when a channel formation region is formed using the first semiconductor film 306 and the region 307c including an amorphous semiconductor is provided between the channel formation region and the impurity semiconductor film 309. In addition, off current can be further reduced while on current and field-effect mobility can be increased when the mixed region 307b and the region 307c including an amorphous semiconductor are provided. This is because the mixed region 307b includes the microcrystalline semiconductor region 331a having a conical or pyramidal shape and the region 307c including an amorphous semiconductor is formed using a well-ordered semiconductor film which has few defects and a steep tail of a level at a band edge in the valence band.

The conductive film 311 can be formed using the material and the structure illustrated in Embodiment 3 as appropriate.

The conductive film 311 is formed by a CVD method, a sputtering method, or a vacuum evaporation method. Alternatively, the conductive film 311 may be formed by discharging a conductive nanopaste of silver, gold, copper, or the like by a screen printing method, an ink-jet method, or the like and baking the conductive nanopaste.

The resist mask 313 is formed by a second photolithography process. The resist mask 313 has regions with different thicknesses. Such a resist mask can be formed using a multi-tone mask. The multi-tone mask is preferably used because the number of photomasks used and the number of manufacturing steps can be reduced. In this embodiment, a resist mask formed using the multi-tone mask can be used in a process of forming patterns of the first semiconductor film 306 and the second semiconductor film 307 and a process of separating a source region and a drain region.

A multi-tone mask is a mask capable of light exposure with multi-level light quantity; typically, light exposure is performed with three levels of light quantity to provide an exposed region, a half-exposed region, and an unexposed region. By one light exposure and development step with the use of a multi-tone mask, a resist mask with plural thicknesses (typically, two kinds of thicknesses) can be formed. Therefore, by the use of a multi-tone mask, the number of photomasks can be reduced.

Next, with the use of the resist mask 313, the first semiconductor film 306, the second semiconductor film 307, the impurity semiconductor film 309, and the conductive film 311 are etched. Through this process, the first semiconductor film 306, the second semiconductor film 307, the impurity semiconductor film 309, and the conductive film 311 are divided for each element, to form a third semiconductor film 315, an impurity semiconductor film 317, and a conductive film 319. Note that the third semiconductor film 315 includes a microcrystalline semiconductor film 315a obtained by etching the first semiconductor film 306, a mixed region 315b obtained by etching the mixed region 307b of the second semiconductor film 307, and a region 315c including an amorphous semiconductor obtained by etching the region 307c including an amorphous semiconductor of the second semiconductor film 307 (see FIG. 5C).

Next, the resist mask 321 is reduced in its size to form separated resist mask 323. Ashing using oxygen plasma may be performed in order to reduce the size of the resist mask. Here, ashing is performed on the resist mask 321 so that the resist mask 323 is separated over the gate electrode. Accordingly, the resist mask 323 can be formed (see FIG. 6A).

Figure 6A:
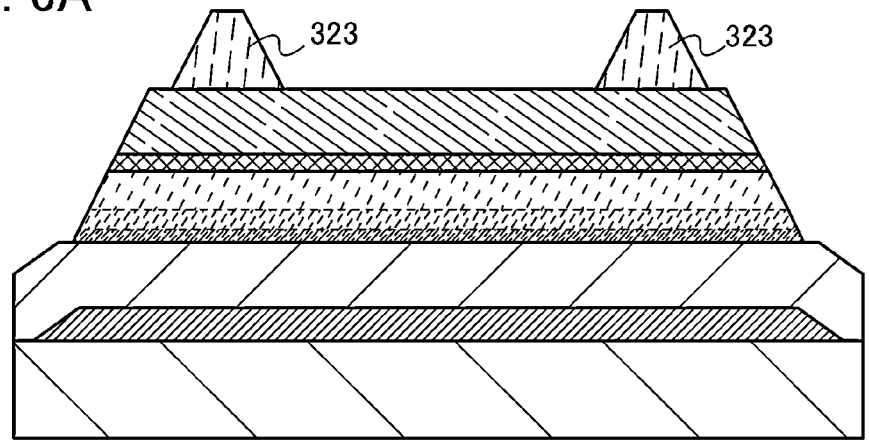
FIGS. 6A to 6C are diagrams illustrating one embodiment of a method for manufacturing a thin film transistor.
Figure 6B:
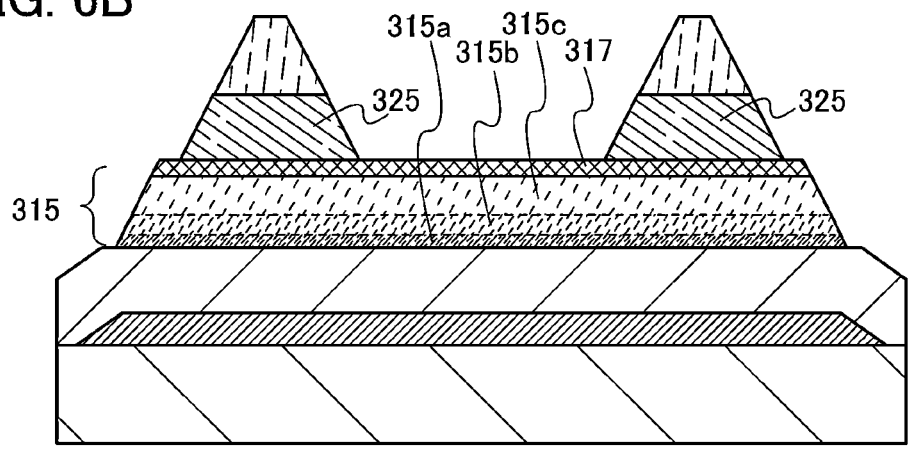
Figure 6C:
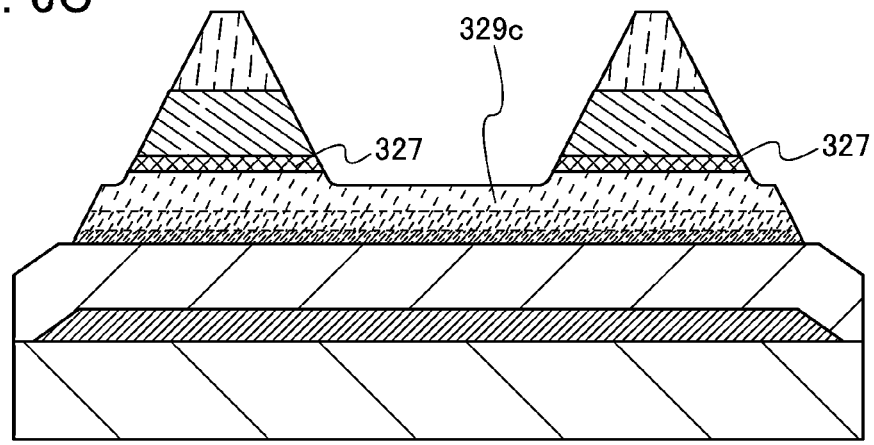

Next, the conductive film 319 is etched using the resist mask 323, whereby wirings 325 serving as source and drain electrodes are formed (see FIG. 6B). Here, dry etching is employed. The wirings 325 serve not only as source and drain electrodes but also as signal lines. However, without limitation thereto, a signal line may be provided separately from the source and drain electrodes.

Next, with the use of the resist mask 323, a region 315c including the amorphous semiconductor of the third semiconductor film 315 and the impurity semiconductor film 317 are each partly etched. Here, dry etching is employed. Up to this step, a region 329c which includes an amorphous semiconductor and has a depression on the surface and impurity semiconductor films 327 serving as source and drain regions are formed (see FIG. 6C). After that, the resist mask 323 is removed.

Note that, here, the conductive film 319, the region 315c including an amorphous semiconductor, and the impurity semiconductor film 317 are each partly etched by dry etching, so that the conductive film 319 is isotropically etched; thus, the side surfaces of the wirings 325 are substantially aligned with the side surfaces of the impurity semiconductor films 327.

Note that the impurity semiconductor film 317 and the region 315c including an amorphous semiconductor may be partly etched after removal of the resist mask 323. In this etching, the impurity semiconductor film 317 is etched using the wirings 325, so that the side surfaces of the wirings 325 are substantially aligned with the side surfaces of the impurity semiconductor films 327.

Alternatively, the conductive film 319 may be subjected to wet etching and the region 315c including an amorphous semiconductor and the impurity semiconductor film 317 may be subjected to dry etching. The conductive film 319 is isotropically etched by the wet etching, so that the wirings 325 each side surface of which is on an inner side than the side surfaces of the resist mask 323 are formed. Then, side surfaces of the impurity semiconductor films 327 are located on outer sides than side surfaces of the wirings 325.

Next, dry etching may be performed after the removal of the resist mask 323. A condition of dry etching is set so that a surface of an exposed portion of the region 329c including an amorphous semiconductor is not damaged and the etching rate with respect to the region 329c including an amorphous semiconductor is low. In other words, a condition which gives almost no damages to the exposed surface of the region 329c including an amorphous semiconductor and hardly reduces the thickness of the exposed region of the region 329c including an amorphous semiconductor is applied. As an etching gas, $Cl_2$, $CF_4$, $N_2$, or the like is typically used. There is no particular limitation on an etching method and an inductively coupled plasma (ICP) method, a capacitively coupled plasma (CCP) method, an electron cyclotron resonance (ECR) method, a reactive ion etching (RIE) method, or the like can be used.

Next, the surface of the region 329c including an amorphous semiconductor may be subjected to plasma treatment typified by water plasma treatment, ammonia plasma treatment, nitrogen plasma treatment, or the like.

The water plasma treatment can be performed by generating plasma using a gas containing water as its main component, typified by water vapor, which is introduced into the reaction space.

As described above, after formation of the impurity semiconductor films 327, when dry etching is further performed under a condition which gives no damages to the region 329c including an amorphous semiconductor, an impurity such as a residue existing on the exposed surface of the region 329c including an amorphous semiconductor can be removed. By the plasma treatment, insulation between the source region and the drain region can be ensured, and thus, in a thin film transistor which is completed, off current can be reduced and variation in electric characteristics can be reduced.

Through the above steps, the thin film transistor having preferable electric characteristics can be manufactured using a small number of masks with high productivity.

Embodiment 5

In this embodiment, an element substrate and a display device including the element substrate to which any of the thin film transistors described in Embodiments 1 to 4 can be applied are described below. As examples of the display device, a liquid crystal display device, a light-emitting display device, electronic paper, and the like are given. The thin film transistor described in any of the above embodiments can be used for an element substrate of any other display devices. Here, a liquid crystal display device including the thin film transistor described in Embodiment 4, typically, a vertical alignment (VA) mode liquid crystal display device will be described with reference to FIG. 10 and FIG. 11.

Figure 10:
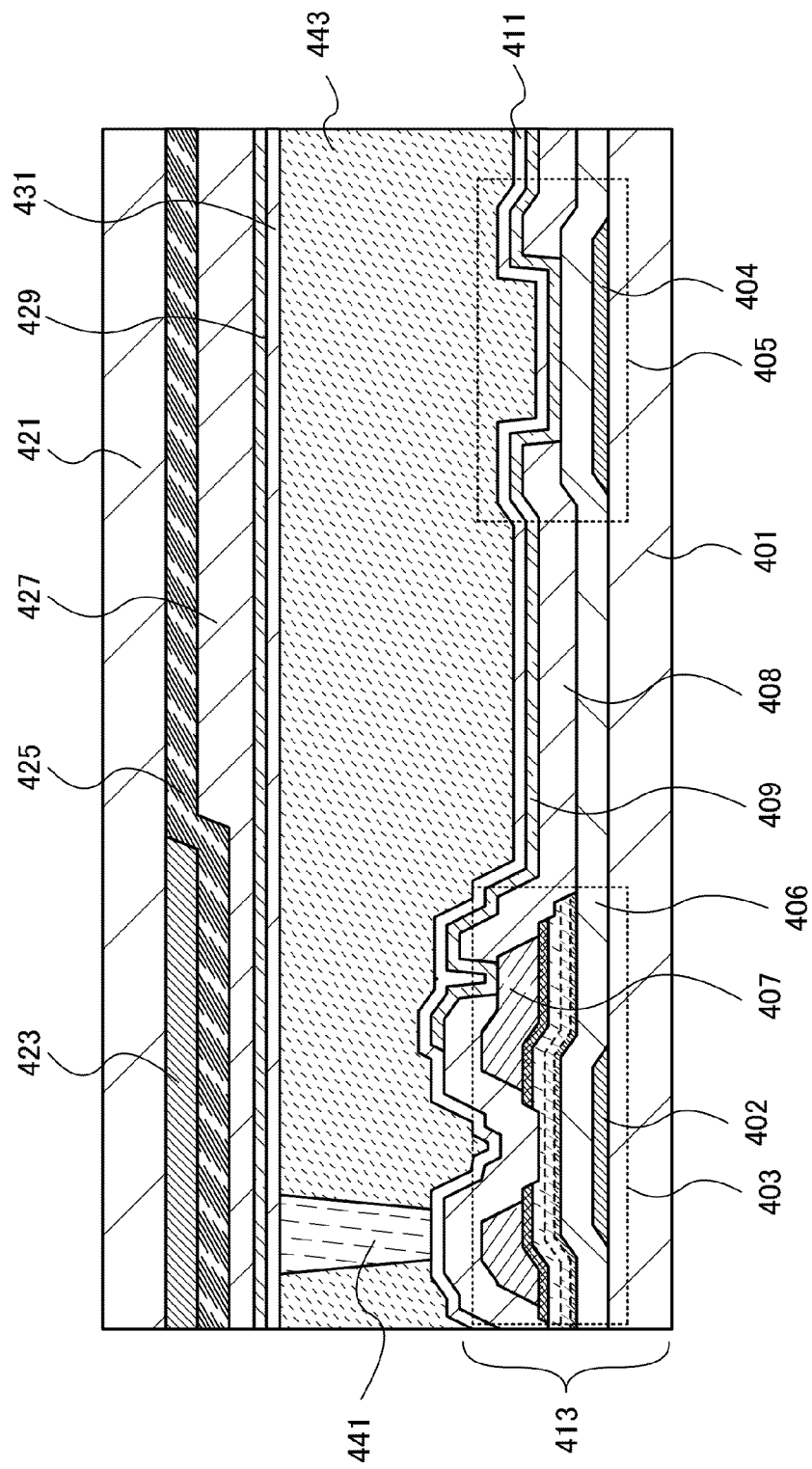
FIG. 10 is a cross-sectional view illustrating a display device.

FIG. 10 illustrates a cross-sectional structure of a pixel portion of a liquid crystal display device. A thin film transistor 403 manufactured by any of the above embodiments and a capacitor 405 are formed over a substrate 401. Further, a pixel electrode 409 is formed over an insulating film 408 which is formed over the thin film transistor 403. A source or drain electrode 407 of the thin film transistor 403 and the pixel electrode 409 are connected to each other in an opening formed in the insulating film 408. An alignment film 411 is formed over the pixel electrode 409.

The capacitor 405 includes a capacitor wiring 404 which is formed at the same time as a gate electrode 402 of the thin film transistor 403, a gate insulating film 406, and the pixel electrode 409.

A stack body including components from the substrate 401 to the alignment film 411 is referred to as an element substrate 413.

A counter substrate 421 is provided with a coloring film 425 and a light-blocking film 423 for blocking incidence of light into the thin film transistor 403. In addition, a planarizing film 427 is formed on the light-blocking film 423 and the coloring film 425. A counter electrode 429 is formed on the planarizing film 427, and an alignment film 431 is formed on the counter electrode 429.

Note that the light-blocking film 423, the coloring film 425, and the planarizing film 427 on the counter substrate 421 function as a color filter. Note that one or both of the light-blocking film 423 and the planarizing film 427 are not necessarily formed on the counter substrate 421.

The coloring film has a function of preferentially transmitting light of a predetermined wavelength range, among light of a wavelength range of visible light. In general, a coloring film which preferentially transmits light of a wavelength range of red light, a coloring film which preferentially transmits light of a wavelength range of blue light, and a coloring film which preferentially transmits light of a wavelength range of green light are combined for a color filter. However, the combination of the coloring films is not limited to the above combination.

The substrate 401 and the counter substrate 421 are fixed to each other by a sealing material (not illustrated), and a liquid crystal film 443 fills a space surrounded by the substrate 401, the counter substrate 421, and the sealing material. Further, a spacer 441 is provided to keep a distance between the substrate 401 and the counter substrate 421.

The pixel electrode 409, the liquid crystal film 443, and the counter electrode 429 are overlapped with each other, whereby a liquid crystal element is formed.

Figure 11:
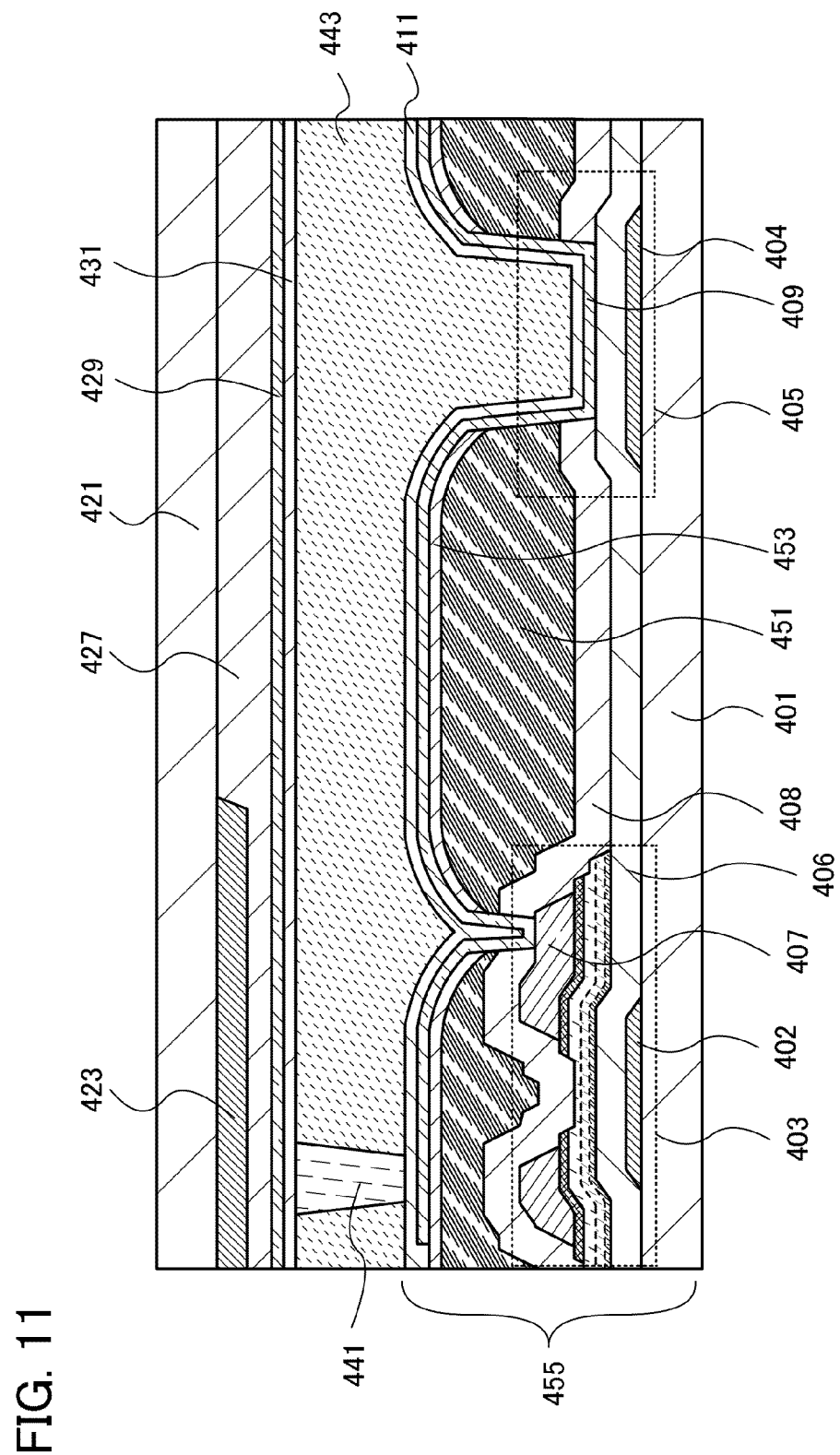
FIG. 11 is a cross-sectional view illustrating a display device.

FIG. 11 illustrates a liquid crystal display device different from that in FIG. 10. Here, a coloring film is formed not on the counter substrate 421 side but over a substrate 401 provided with a thin film transistor 403.

FIG. 11 illustrates a cross-sectional structure of a pixel portion of a liquid crystal display device. The thin film transistor 403 manufactured by any of the above embodiments and a capacitor 405 are formed over the substrate 401.

Further, a coloring film 451 is formed over an insulating film 408 which is formed over the thin film transistor 403. Further, a protective film 453 is formed over the coloring film 451 in order to prevent an impurity contained in the coloring film 451 from being mixed into a liquid crystal film 443. A pixel electrode 409 is formed over the coloring film 451 and the protective film 453. As the coloring film 451, a film which preferentially transmits light of a predetermined wavelength range (red light, blue light, or green light) may be formed for each pixel. Further, since the coloring film 451 also functions as a planarizing film, uneven alignment of the liquid crystal film 443 can be suppressed.

A source or drain electrode 407 of the thin film transistor 403 and the pixel electrode 409 are connected to each other in an opening formed in the insulating film 408, the coloring film 451, and the protective film 453. An alignment film 411 is formed over the pixel electrode 409.

The capacitor 405 includes a capacitor wiring 404 which is formed at the same time as a gate electrode 402 of the thin film transistor 403, a gate insulating film 406, and the pixel electrode 409.

A stack body including components from the substrate 401 to the alignment film 411 is referred to as an element substrate 455.

The counter substrate 421 is provided with a light-blocking film 423 for blocking incidence of light into the thin film transistor 403 and a planarizing film 427 covering the light-blocking film 423 and the counter substrate 421. A counter electrode 429 is formed on the planarizing film 427, and an alignment film 431 is formed on the counter electrode 429.

The pixel electrode 409, the liquid crystal film 443, and the counter electrode 429 are overlapped with each other, whereby a liquid crystal element is formed.

Note that although the VA mode liquid crystal display device is described here as a liquid crystal display device, the present invention is not limited thereto. That is, an element substrate which is formed using the thin film transistor in accordance with Embodiment 1 can also be applied to an FFS mode liquid crystal display device, an IPS mode liquid crystal display device, a TN mode liquid crystal display device, and other modes of liquid crystal display devices.

Since the thin film transistor with large on current, high field-effect mobility, and small off current is used as a pixel transistor in the liquid crystal display device of this embodiment, image quality (e.g., contrast) of the liquid crystal display device can be improved. Further, electric characteristics of the thin film transistor are not degraded even when the area of the thin film transistor is reduced; therefore, by reducing the area of the thin film transistor, the aperture ratio of the liquid crystal display device can be increased. In addition, the area of a pixel can be reduced, so that resolution of the liquid crystal display device can be improved.

Further, in the liquid crystal display device illustrated in FIG. 11, the light-blocking film 423 and the coloring film 451 are not formed over the same substrate. Therefore, misalignment of a mask in formation of the coloring film 451 can be prevented. Accordingly, the area of the light-blocking film 423 is not necessarily increased, which can increase the aperture ratio of the pixel.

Embodiment 6

By being provided with a light-emitting element without formation of the alignment film 411, the element substrate 413 described in Embodiment 5 can be used for a light-emitting display device or a light-emitting device. In a light-emitting display device or a light-emitting device, a light-emitting element utilizing electroluminescence is typically used as a light-emitting element. Light-emitting elements utilizing electroluminescence are classified according to whether a light-emitting material is an organic compound or an inorganic compound. In general, the former is referred to as an organic EL element and the latter as an inorganic EL element.

In the light-emitting display device or the light-emitting device of this embodiment, a thin film transistor with large on current, high field-effect mobility, and small off current is used as a pixel transistor; therefore, the light-emitting display device or the light-emitting device can have favorable image quality (for example, a high contrast) and low power consumption.

Embodiment 7

A display device including the thin film transistor according to any of the above embodiments can be applied to a variety of electronic devices (including an amusement machine). Examples of the electronic devices are a television device (also referred to as a television or a television receiver), a monitor of a computer or the like, electronic paper, a camera such as a digital camera or a digital video camera, a digital photo frame, a mobile phone (also referred to as a mobile telephone or a mobile phone device), a portable game console, a portable information terminal, an audio reproducing device, a large-sized game machine such as a pachinko machine, and the like. In particular, as described in Embodiments 5 and 6, the thin film transistor according to any of the above embodiments can be applied to a liquid crystal display device, a light-emitting device, an electrophoretic display device, or the like and thus can be used for a display portion of an electronic device. Specific examples will be described below.

A semiconductor device including the thin film transistor according to any of the above embodiments can be applied to electronic paper. An electronic paper can be used for electronic devices of a variety of fields as long as they can display data. For example, electronic paper can be applied to an electronic book (e-book) device, a poster, an advertisement in a vehicle such as a train, a digital signage, a public information display (PID), displays of various cards such as a credit card, and the like. Examples of such electronic devices are illustrated in FIGS. 12A to 12D.

Figure 12A:
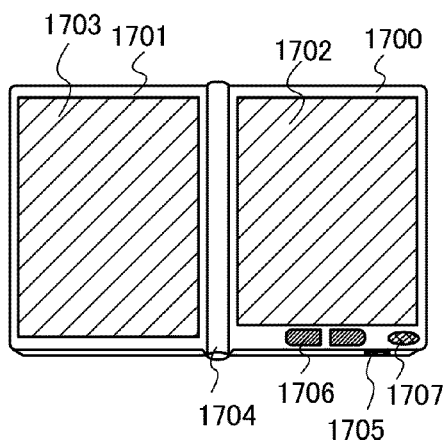
FIGS. 12A to 12D are each a diagram illustrating an electronic device to which a thin film transistor is applied.

FIG. 12A illustrates an example of the electronic book device. For example, the electronic book device includes two housings, a housing 1700 and a housing 1701. The housing 1700 and the housing 1701 are combined with a hinge 1704 so that the electronic book device can be opened and closed. With such a structure, the electronic book device can operate like a paper book.

A display portion 1702 and a display portion 1703 are incorporated in the housing 1700 and the housing 1701, respectively. The display portion 1702 and the display portion 1703 may be configured to display one image or different images. In the case where the display portion 1702 and the display portion 1703 display different images, for example, a display portion on the right side (the display portion 1702 in FIG. 12A) can display text and a display portion on the left side (the display portion 1703 in FIG. 12A) can display graphics.

FIG. 12A illustrates an example in which the housing 1700 is provided with an operation portion and the like. For example, the housing 1700 is provided with a power source 1705, an operation key 1706, a speaker 1707, and the like. With the operation key 1706, pages can be turned. Note that a keyboard, a pointing device, and the like may be provided on the same surface as the display portion of the housing. Furthermore, an external connection terminal (an earphone terminal, a USB terminal, a terminal that can be connected to various cables including an AC adapter and a USB cable, or the like), a recording medium insertion portion, and the like may be provided on the back surface or the side surface of the housing. Further, the electronic book device may have a function of an electronic dictionary.

The electronic book device may transmit and receive data wirelessly. Through wireless communication, desired book data or the like can be purchased and downloaded from an electronic book server.

Figure 12B:
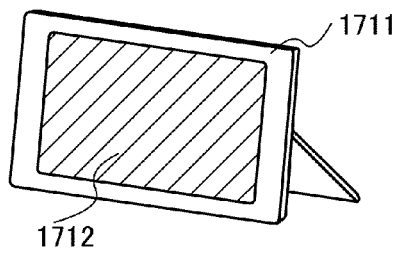

FIG. 12B illustrates an example of the digital photo frame. For example, in the digital photo frame, a display portion 1712 is incorporated in a housing 1711. Various images can be displayed in the display portion 1712. For example, the display portion 1712 can display data of an image shot by a digital camera or the like to function as a normal photo frame.

Note that the digital photo frame is provided with an operation portion, an external connection portion (a USB terminal, a terminal that can be connected to various cables including a USB cable, or the like), a recording medium insertion portion, and the like. Although these components may be provided on the surface on which the display portion is provided, it is preferable to provide them on the side surface or the back surface for the design of the digital photo frame. For example, a memory storing data of an image taken by a digital camera is inserted into the recording medium insertion portion of the digital photo frame, whereby the image data can be transferred and then displayed in the display portion 1712.

The digital photo frame may be configured to transmit and receive data wirelessly. The structure may be employed in which desired image data is transferred wirelessly and displayed.

Figure 12C:
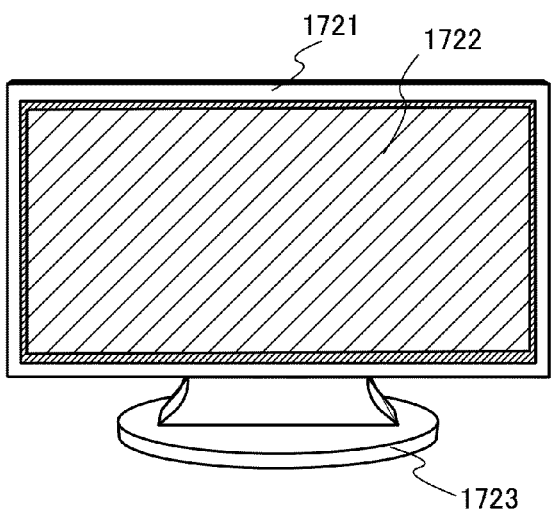

FIG. 12C illustrates an example of the television device. In the television set, a display portion 1722 is incorporated in a housing 1721. The display portion 1722 can display an image. Further, the housing 1721 is supported by a stand 1723 here. The display device described in Embodiment 5 or Embodiment 6 can be applied to the display portion 1722.

The television device can be operated with an operation switch of the housing 1721 or a separate remote controller. Channels and volume can be controlled with an operation key of the remote controller so that an image displayed in the display portion 1722 can be controlled. Further, the remote controller may be provided with a display portion for displaying data output from the remote controller.

Note that the television device is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 12D:
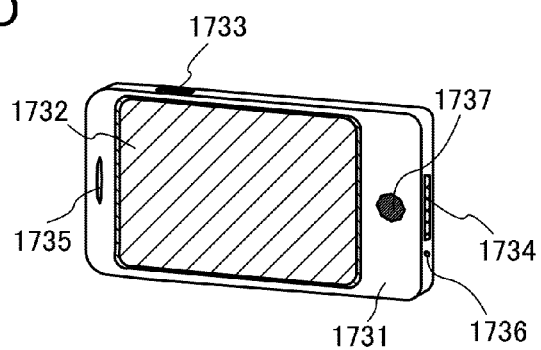

FIG. 12D illustrates an example of the mobile phone. The mobile phone is provided with a display portion 1732 incorporated in a housing 1731, an operation button 1733, an operation button 1737, an external connection port 1734, a speaker 1735, a microphone 1736, and the like. Any of the display devices described in Embodiments 5 and 6 can be applied to the display portion 1732.

The display portion 1732 of the mobile phone illustrated in FIG. 12D is a touch panel. When the display portion 1732 is touched with a finger or the like, contents displayed in the display portion 1732 can be controlled. Further, operations such as making calls and composing mails can be performed by touching the display portion 1732 with a finger or the like.

There are mainly three screen modes for the display portion 1732. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1732 so that characters displayed on a screen can be input. In that case, it is preferable to display a keyboard or number buttons on a large area of the screen of the display portion 1732.

When a detection device including a sensor for detecting inclination, such as a gyroscope or an acceleration sensor, is provided inside the mobile phone, display data of the display portion 1732 can be automatically switched by determining the orientation of the mobile phone (whether the mobile phone is placed horizontally or vertically for a landscape mode or a portrait mode).

The screen modes are switched by touching the display portion 1732 or using the operation button 1737 of the housing 1731. Alternatively, the screen modes can be switched depending on kinds of images displayed in the display portion 1732. For example, when a signal of an image displayed in the display portion is the one of moving image data, the screen mode can be switched to the display mode. When the signal is the one of text data, the screen mode can be switched to the input mode.

Further, in the input mode, when input by touching the display portion 1732 is not performed for a certain period of time while a signal detected by an optical sensor in the display portion 1732 is detected, the screen mode may be controlled so as to be switched from the input mode to the display mode.

The display portion 1732 can function as an image sensor. For example, an image of a palm print, a fingerprint, or the like is taken by an image sensor when the display portion 1732 is touched with a palm or a finger, whereby personal authentication can be performed. Further, by providing a backlight or a sensing light source which emits near-infrared light in the display portion, an image of a finger vein, a palm vein, or the like can be taken.

This embodiment can be implemented in combination with any of the structures described in the other embodiments as appropriate.

Example 1

In this example, a structure of a top surface of the microcrystalline semiconductor film formed by the method described in Embodiment 1 and the size of a crystallite in the microcrystalline semiconductor film are described with reference to FIGS. 13A and 13B, FIGS. 14A to 14E, FIG. 15, and FIGS. 16A and 16B. Note that a microcrystalline silicon film was formed as the microcrystalline semiconductor film in this example.

First, a process for forming the microcrystalline silicon film is described.

The microcrystalline silicon film was formed over a glass substrate. Here, deposition conditions of the microcrystalline silicon film in each sample are described.

In Sample 1, the deposition conditions were as follows: the flow rate of hydrogen was 750 sccm; the flow rate of argon was 750 sccm; the pressure was 350 Pa; power of high-frequency power source was 60 W (13.56 MHz); and the distance between electrodes was 25 mm Deposition of the microcrystalline silicon film was performed over the substrate by changing the flow rate of silane in such a manner that a step in which silane is introduced at a flow rate of 5 sccm for 5 seconds and a step in which silane is introduced at a flow rate of 1 sccm for 5 seconds were performed alternately.

In Sample 2, a step in which silane is introduced at a flow rate of 5 sccm for 5 seconds and a step in which silane is introduced at a flow rate of 1 sccm for 10 seconds were performed alternately, which is different from Sample 1. In this manner, deposition of the microcrystalline silicon film was performed over the substrate by changing the flow rate of silane.

In Sample 3 that is a comparative example, the flow rate of silane was fixed. Specifically, deposition of the microcrystalline silicon film was performed over the substrate under such conditions: the flow rate of silane was 5 sccm; the flow rate of hydrogen was 750 sccm; the flow rate of argon was 750 sccm; the pressure was 350 Pa; power of high-frequency power source was 60 W (13.56 MHz); and the distance between electrodes was 25 mm.

In Sample 4 that is another comparative example, the flow rate of silane was fixed. Specifically, deposition of the microcrystalline silicon film was performed over the substrate under such conditions: the flow rate of silane was 1 sccm; the flow rate of hydrogen was 750 sccm; the flow rate of argon was 750 sccm; the pressure was 350 Pa; power of high-frequency power source was 60 W (13.56 MHz); and the distance between electrodes was 25 mm.

In Sample 5 that is another comparative example, a step in which a fixed rate of silane is introduced and a step in which silane is not introduced were performed alternatively. Specifically, the deposition conditions were as follows: the flow rate of hydrogen was 750 sccm; the flow rate of argon was 750 sccm; the pressure was 350 Pa; power of high-frequency power source was 60 W (13.56 MHz); and the distance between electrodes was 25 mm. A step in which silane is introduced at a flow rate of 5 sccm for 5 seconds and a step in which introduction of silane is stopped for 5 seconds while the high-frequency power source was kept on were repeated alternatively, whereby deposition of the microcrystalline silicon film was performed over the substrate.

In Sample 6 that is another comparative example, a step in which a fixed rate of silane is introduced and a step in which silane is not introduced were performed alternatively. Specifically, a different point from Sample 5 is as follows: a step in which silane is introduced at a flow rate of 5 sccm for 5 seconds and a step in which introduction of silane is stopped for 10 seconds while the high-frequency power source was kept on are repeated alternatively. Thus, deposition of the microcrystalline silicon film was performed over the substrate.

In the process of forming Sample 7 that is another comparative example, a microcrystalline semiconductor film was formed by a 2-step method. Specifically, deposition was performed to form a microcrystal silicon film having a thickness of 5 nm under such conditions: the flow rate of silane was 5 sccm; the flow rate of hydrogen was 1500 sccm; the flow rate of argon was 1500 sccm; the pressure was 280 Pa; and power of high-frequency power source was 50 W (13.56 MHz). After that, the flow rate of silane was changed to 10 sccm while the high-frequency power source was kept on and deposition was performed to form a microcrystal silicon film having a thickness of 25 nm.

Note that in Sample 7, after a silicon oxynitride film having a thickness of 100 nm was formed over a substrate, the substrate was carried out from the treatment chamber, and the treatment chamber was cleaned with fluorine plasma. Next, an amorphous silicon film was formed as a protective film in the treatment chamber, the substrate is carried into the treatment chamber, and then the above-mentioned microcrystalline semiconductor film was stacked.

Figure 13A:
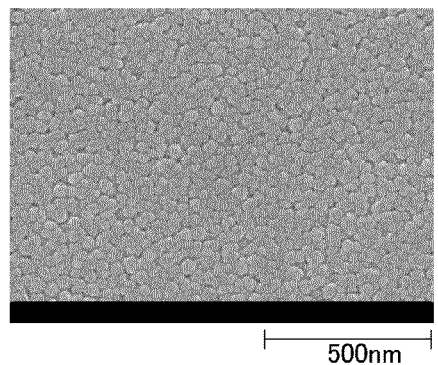
FIGS. 13A and 13B are each an SEM image illustrating a structure of the microcrystalline semiconductor film.
Figure 13B:
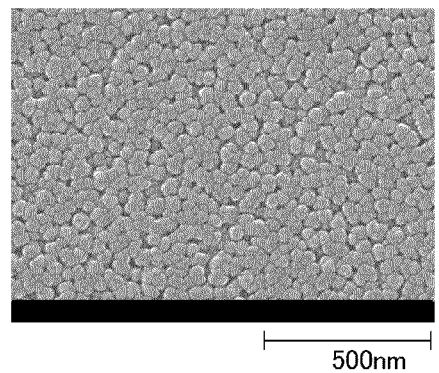
Figure 14A:
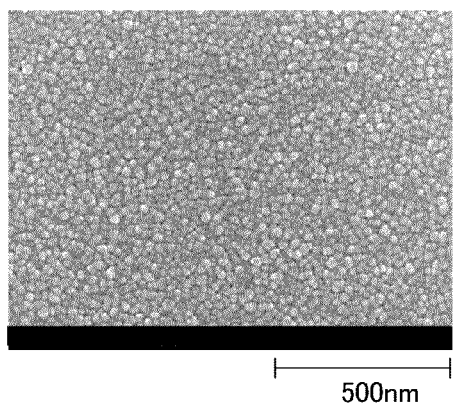
FIGS. 14A to 14E are each an SEM image illustrating a structure of the microcrystalline semiconductor film.
Figure 14B:
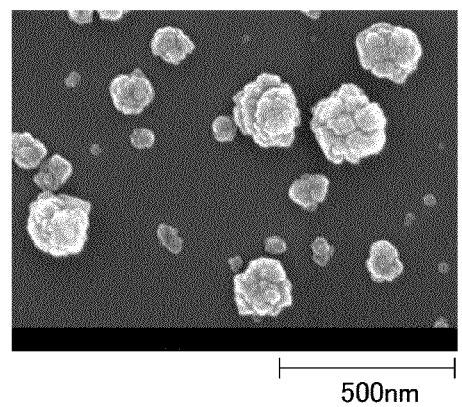
Figure 14C:
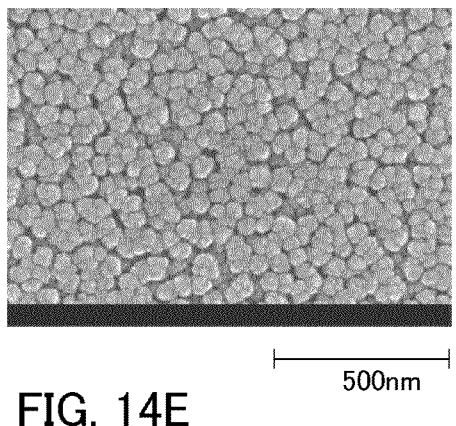
Figure 14D:
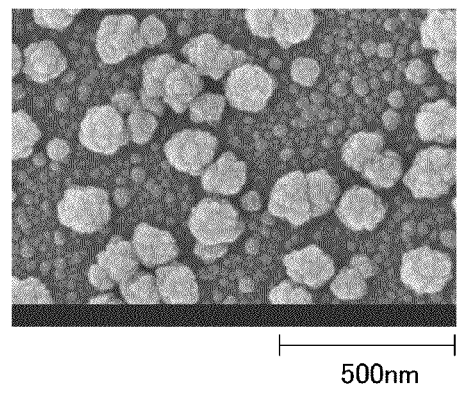
Figure 14E:
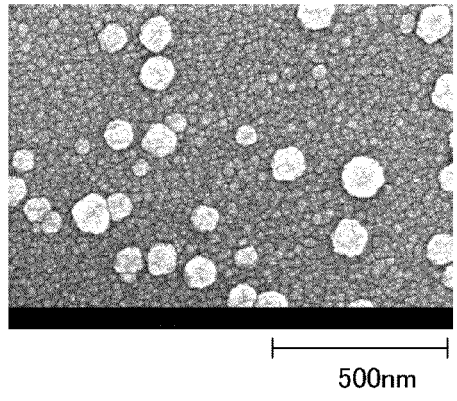

FIG. 13A is an SEM image of Sample 1 and FIG. 13B is an SEM image of Sample 2. FIGS. 14A to 14E are SEM images of comparative examples: Sample 3 to Sample 7.

Figure 15:
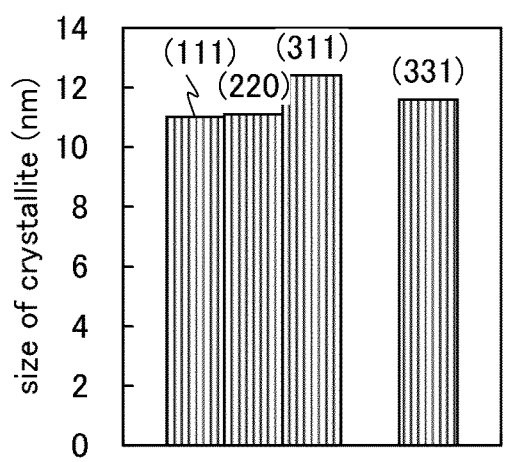
FIG. 15 is a diagram illustrating the size of a crystallite of a microcrystalline silicon film.
Figure 16A:
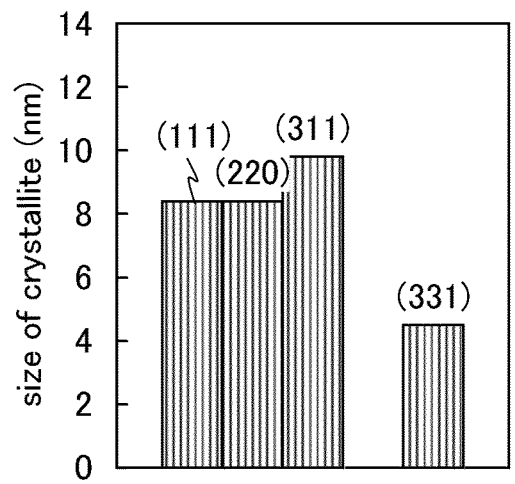
FIGS. 16A and 16B are each a diagram illustrating the size of a crystallite of a microcrystalline silicon film.
Figure 16B:
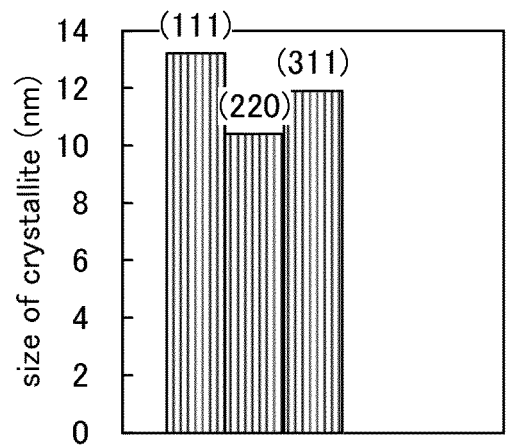
Figure 17A:
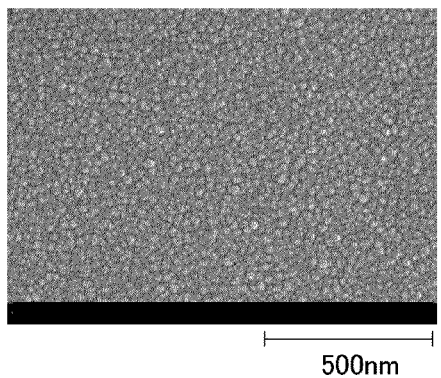
FIGS. 17A to 17D are each an SEM image illustrating a structure of a microcrystalline silicon film.
Figure 17B:
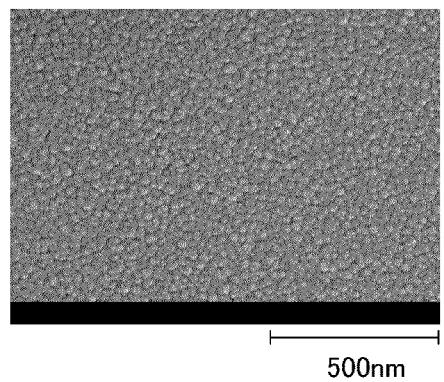
Figure 17C:
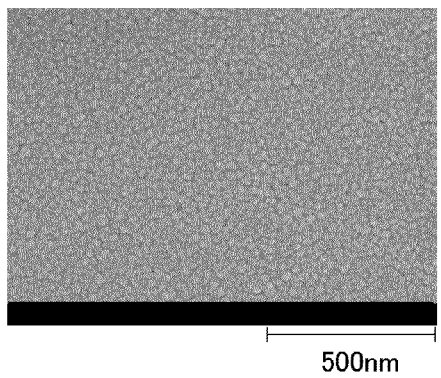
Figure 17D:
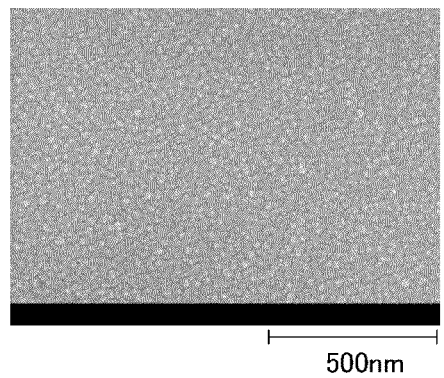

The in-plane XRD measurement results of Sample 1 are shown in FIG. 15 and in-plane XRD measurement results of Sample 3 and Sample 5 which are comparative examples are shown in FIGS. 16A and 16B, respectively. Note that in FIG. 15 and FIGS. 16A and 16B, the sizes of crystallites having plane orientations of (111), (220), (311), and (331) are shown.

As seen from FIGS. 13A and 13B and FIGS. 14A to 14E, it is found that the sizes of crystal grains in the microcrystalline silicon films (Sample 1 and Sample 2) which were formed by the methods in Embodiment 1 are uniform as compared with the microcrystalline silicon films of the comparative examples (Examples 3 to 7). In particular, in the microcrystalline silicon films of Sample 5 and Sample 6 which are formed by alternatively repeating a step in which a fixed rate of silane is introduced for a fixed time and a step in which introduction of silane is stopped for a fixed time while the high-frequency power source was kept on, or in the microcrystalline silicon film of Sample 7 which is formed by the 2-step method, crystal nuclei are easily etched and the density of the crystal nuclei is low; thus, there are many regions where adjacent crystal grains are not in contact with each other. However, in the microcrystalline silicon films of Sample 1 and Sample 2, the sizes of crystal grains are uniform and adjacent crystal grains are in contact with each other.

As seen from FIG. 15 and FIGS. 16A and 16B, it is found that the size of a crystallite included in a crystal grain in the microcrystalline silicon film (Sample 1) formed by the method described in Embodiment 1 is large as compared with the size of a crystallite included in a crystal grain in the microcrystalline silicon film which is a comparative example (Sample 3).

Accordingly, a microcrystalline semiconductor film in which the size of a crystallite included in a crystal grain is large, the sizes of crystal grains are uniform, and adjacent crystal grains are in contact with each other can be formed by the manufacture method described in Embodiment 1.

Example 2

In this example, a structure of a top surface of the microcrystalline semiconductor film formed by the method described in Embodiment 2 and the size of a crystallite in the microcrystalline semiconductor film are described with reference to FIGS. 14A to 14E, FIGS. 16A and 16B, FIGS. 17A to 17D, and FIG. 18. Note that a microcrystalline silicon film was formed as the microcrystalline semiconductor film in this example.

First, a process for forming the microcrystalline silicon film is described.

The microcrystalline silicon film was formed over a glass substrate.

In Sample 8, the deposition conditions were as follows: the flow rate of hydrogen was 750 sccm; the pressure was 350 Pa; power of high-frequency power source was 60 W (13.56 MHz); and the distance between electrodes was 25 mm. A step in which silane is introduced at a flow rate of 5 sccm for 5 seconds and a step in which silane is introduced at a flow rate of 1 sccm for 5 seconds were performed alternately. During the same period when the rate of the silane was changed, a step in which argon is introduced at a flow rate of 750 sccm for 5 seconds and a step in which introduction of argon is stopped for 5 seconds while the high-frequency power source was kept on were performed alternately, whereby deposition of the microcrystalline silicon film was performed over the substrate. Note that when the flow rate of silane was 5 sccm, the flow rate of argon was 750 sccm, and when the flow rate of silane was 1 sccm, the introduction of argon was stopped.

In Sample 9, a different point from Sample 8 is as follows: a step in which silane is introduced at a flow rate of 5 sccm for 5 seconds and a step in which silane is introduced at a flow rate of 1 sccm for 10 seconds were performed alternately; and during the same period when the rate of the silane was changed, a step in which argon is introduced at a flow rate of 750 sccm for 5 seconds and a step in which introduction of argon is stopped for 10 seconds while the high-frequency power source was kept on were performed alternately. Thus, deposition of the microcrystalline silicon film was performed over the substrate. Note that when the flow rate of silane was 5 sccm, the flow rate of argon was 750 sccm, and when the flow rate of silane was 1 sccm, the introduction of argon was stopped.

The timing of the introduction of argon in Sample 10 was different from the timing of the introduction of argon in Sample 8. In Sample 10, when the flow rate of silane was 5 sccm, the introduction of argon was stopped, and when the rate of silane was 1 sccm, argon was introduced at a flow rate of 750 sccm.

The timing of the introduction of argon in Sample 11 was different from the timing of the introduction of argon in Sample 9. In Sample 11, in a manner the same as that of Sample 10, when the flow rate of silane was 5 sccm, the introduction of argon was stopped, and when the rate of silane was 1 sccm, argon was introduced at a flow rate of 750 sccm.

FIGS. 17A, 17B, 17C, and 17D are SEM images of Sample 8, Sample 9, Sample 10, and Sample 11, respectively.

Figure 18:
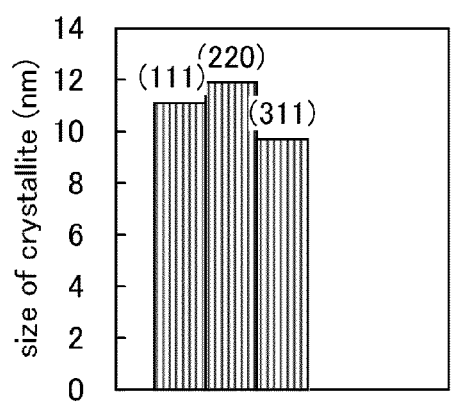
FIG. 18 is a diagram illustrating the size of a crystallite of a microcrystalline silicon film.

The in-plane XRD measurement results of Sample 9 are shown in FIG. 18. Note that in FIG. 18, the sizes of a crystallite having plane orientations of (111), (220), and (311) are shown.

As seen from FIGS. 17A to 17D, it is found that in the microcrystalline silicon films formed by the manufacture method described in Embodiment 2 (Sample 8 and Sample 11), although the sizes of the crystal grains are small, the crystal grains are uniform in size and adjoin as compared with the microcrystalline silicon films (Samples 3 to 7) formed as comparative examples in Example 1.

As seen from FIG. 18, it is found that the size of a crystallite included in a crystal grain in the microcrystalline silicon film (Sample 9) described in Embodiment 2 is large as compared with a crystallite included in a crystal grain in the microcrystalline silicon film (Sample 3) that is a comparative example described in Example 1.

Accordingly, a microcrystalline semiconductor film in which the size of a crystallite included in a crystal grain is large, the sizes of crystal grains are uniform, and the crystal grains are adjacent to each other can be formed by the manufacture method described in Embodiment 2.

This application is based on Japanese Patent Application serial no. 2009-172427 filed with Japan Patent Office on Jul. 23, 2009, the entire contents of which are hereby incorporated by reference.

What is claimed is:

1. A method for forming a semiconductor device comprising the steps of:
   introducing hydrogen and a deposition gas containing silicon or germanium into a treatment chamber,
   periodically increasing and decreasing a flow rate of the deposition gas,
   generating a plasma in the treatment chamber by supplying high-frequency power so that a microcrystalline semiconductor film is formed over a substrate, and
   manufacturing a thin film transistor comprising the microcrystalline semiconductor film,
   wherein a flow rate of the hydrogen is constant,
   wherein the step of periodically increasing and decreasing the flow rate of the deposition gas comprises a first step and a second step alternately and repeatedly,
   wherein the first step is a step of increasing the flow rate of the deposition gas from a first flow rate to a second flow rate,
   wherein the second step is a step of decreasing the flow rate of the deposition gas from the second flow rate to the first flow rate, and
   wherein the first flow rate is a positive value.

2. The method for forming a semiconductor device according to claim 1, further comprising the steps of:
   forming the microcrystalline semiconductor film over a gate insulating film formed over a gate electrode;
   forming a pair of impurity semiconductor films over the microcrystalline semiconductor film; and forming a wiring over the pair of impurity semiconductor films.

3. A method for forming a semiconductor device comprising the steps of:
   introducing hydrogen, a deposition gas containing silicon or germanium, and a rare gas into a treatment chamber,
   periodically increasing and decreasing a flow rate of the deposition gas,
   generating a plasma in the treatment chamber by supplying high-frequency power so that a microcrystalline semiconductor film is formed over a substrate, and
   manufacturing a thin film transistor comprising the microcrystalline semiconductor film,
   wherein a flow rate of the hydrogen and a flow rate of the rare gas are constant,
   wherein the step of periodically increasing and decreasing the flow rate of the deposition gas comprises a first step and a second step alternately and repeatedly,
   wherein the first step is a step of increasing the flow rate of the deposition gas from a first flow rate to a second flow rate,
   wherein the second step is a step of decreasing the flow rate of the deposition gas from the second flow rate to the first flow rate, and
   wherein the first flow rate is a positive value.

4. The method for forming a semiconductor device according to claim 3, further comprising the steps of:
   forming the microcrystalline semiconductor film over a gate insulating film formed over a gate electrode;
   forming a pair of impurity semiconductor films over the microcrystalline semiconductor film; and
   forming a wiring over the pair of impurity semiconductor films.

5. A method for forming a semiconductor device film comprising the steps of:
   introducing hydrogen, a deposition gas containing silicon or germanium, and a rare gas into a treatment chamber,
   periodically increasing and decreasing a flow rate of the deposition gas and a flow rate of the rare gas,
   generating a plasma in the treatment chamber by supplying high-frequency power so that a microcrystalline semiconductor film is formed over a substrate, and
   manufacturing a thin film transistor comprising the microcrystalline semiconductor film,
   wherein the step of periodically increasing and decreasing the flow rate of the deposition gas comprises a first step and a second step alternately and repeatedly,
   wherein the first step is a step of increasing the flow rate of the deposition gas from a first flow rate to a second flow rate,
   wherein the second step is a step of decreasing the flow rate of the deposition gas from the second flow rate to the first flow rate, and
   wherein the first flow rate is a positive value.

6. The method for forming a semiconductor device according to claim 5,
   wherein the step of periodically increasing and decreasing the flow rate of the rare gas comprises a third step and a fourth step alternately and repeatedly,
   wherein the third step is a step of increasing the flow rate of the rare gas from a third flow rate to a fourth flow rate, and
   wherein the fourth step is a step of decreasing the flow rate of the rare gas from the fourth flow rate to the third flow rate.

7. The method for forming a semiconductor device according to claim 5, further comprising the steps of:
   forming the microcrystalline semiconductor film over a gate insulating film formed over a gate electrode;
   forming a pair of impurity semiconductor films over the microcrystalline semiconductor film; and
   forming a wiring over the pair of impurity semiconductor films.

8. A method for forming a semiconductor device comprising the steps of:
   introducing hydrogen, a deposition gas containing silicon or germanium, and a rare gas into a treatment chamber,
   periodically increasing and decreasing a flow rate of the deposition gas and a flow rate of the rare gas,
   generating a plasma in the treatment chamber by supplying high-frequency power so that a microcrystalline semiconductor film is formed over a substrate, and
   manufacturing a thin film transistor comprising the microcrystalline semiconductor film,
   wherein the flow rate of the deposition gas and the flow rate of the rare gas are periodically and simultaneously increased and decreased,
   wherein the step of periodically increasing and decreasing the flow rate of the deposition gas comprises a first step and a second step alternately and repeatedly,
   wherein the first step is a step of increasing the flow rate of the deposition gas from a first flow rate to a second flow rate,
   wherein the second step is a step of decreasing the flow rate of the deposition gas from the second flow rate to the first flow rate, and
   wherein the first flow rate is a positive value.

9. The method for forming a semiconductor device according to claim 8,
   wherein the step of periodically increasing and decreasing the flow rate of the rare gas comprises a third step and a fourth step alternately and repeatedly,
   wherein the third step is a step of increasing the flow rate of the rare gas from a third flow rate to a fourth flow rate, and
   wherein the fourth step is a step of decreasing the flow rate of the rare gas from the fourth flow rate to the third flow rate.

10. The method for forming a semiconductor device according to claim 8, further comprising the steps of:
    forming the microcrystalline semiconductor film over a gate insulating film formed over a gate electrode;
    forming a pair of impurity semiconductor films over the microcrystalline semiconductor film; and
    forming a wiring over the pair of impurity semiconductor films.

* * * * *

UNITED STATES PATENT AND TRADEMARK OFFICE
CERTIFICATE OF CORRECTION

PATENT NO.         : 8,557,687 B2
APPLICATION NO.    : 12/838023
DATED              : October 15, 2013
INVENTOR(S)        : Ryota Tajima et al.

It is certified that error appears in the above-identified patent and that said Letters Patent is hereby corrected as shown below:

In the Claims
In claim 5, column 31, line 34, delete the word "film".

Signed and Sealed this
Eleventh Day of March, 2014

Michelle K. Lee
*Deputy Director of the United States Patent and Trademark Office*